United States Patent
Okuyama

(10) Patent No.: US 8,581,328 B2
(45) Date of Patent: Nov. 12, 2013

(54) SEMICONDUCTOR MEMORY DEVICE

(75) Inventor: Yutaka Okuyama, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 225 days.

(21) Appl. No.: 13/006,346

(22) Filed: Jan. 13, 2011

(65) Prior Publication Data

US 2011/0175156 A1 Jul. 21, 2011

(30) Foreign Application Priority Data

Jan. 18, 2010 (JP) .................................. 2010-007751

(51) Int. Cl.
*H01L 29/792* (2006.01)

(52) U.S. Cl.
USPC ........... 257/324; 257/315; 257/316; 257/319; 257/321; 257/E29.309

(58) Field of Classification Search
USPC ........... 257/324, 315, 316, 319, 321, E29.309
See application file for complete search history.

(56) References Cited

U.S. PATENT DOCUMENTS

| 7,089,955 | B1 * | 8/2006 | Komro, Sr. ................ 137/301 |
| 7,235,441 | B2 | 6/2007 | Yasui et al. |
| 7,442,986 | B2 | 10/2008 | Yasui et al. |
| 2009/0050956 | A1 | 2/2009 | Ishimaru et al. |

FOREIGN PATENT DOCUMENTS

| JP | 2005-123518 A | 5/2005 |
| JP | 2009-054707 A | 3/2009 |

* cited by examiner

*Primary Examiner* — Long Pham
(74) *Attorney, Agent, or Firm* — Miles & Stockbridge P.C.

(57) ABSTRACT

In a semiconductor memory device having split-gate MONOS memory cells, disturb resistance during writing by a SSI method is improved. In addition, with an improvement in the disturb resistance of a non-selected memory cell, a reduction in the area occupied by a memory module can be achieved. Over a side surface of a memory gate electrode, a first insulating film is formed between a charge storage film and a second insulating film so that the total thickness of the first and second insulating films over the side surface of the memory gate electrode is larger than the thickness of the second insulating film under the memory gate electrode.

21 Claims, 16 Drawing Sheets

FIG. 3

|  |  | CGL0 | CGL1~3 | MGL | SL0 | SL1 | BL0 | BL1 | SELECTED CELL |
|---|---|---|---|---|---|---|---|---|---|
| WRITING | SOURCE SIDE INJECTION | 1 | 0 | 9 | 5 | 0 | 0.4 | 1.5 | BIT1 |
| ERASING | BTBT | 0 | 0 | −6 | 6 | 0 | OPEN | OPEN | CELL CONNECTED TO BOTH SL0 AND MGL |
|  | FN TUNNELING INJECTION OF HOLES FROM GATE | 0 | 0 | 15 | 0 | 0 | 0 | 0 | ALL |
|  | FN TUNNELING INJECTION OF HOLES FROM SUBSTRATE | 0 | 0 | −15 | 0 | 0 | 0 | 0 | ALL |
| READING | REVERSE DIRECTION | 1.5 | 0 | 1.5 | 0 | 0 | 1 | 0 | BIT1 |
|  | FORWARD DIRECTION | 1.5 | 0 | 1.5 | 1.5 | 0 | 0 | 1 | BIT1 |

FIG. 4

|  | CELL | Vsg | Vmg | Vs | Vd | Vwell |
|---|---|---|---|---|---|---|
| WRITING | BIT1 | 1 | 9 | 5 | 0.4 | 0 |
| WRITING DISTURB | DISTA | 1 | 9 | 5 | 1.5 | 0 |
|  | DISTB | 0 | 9 | 5 | 1.5 | 0 |
|  | DISTC | 0 | 9 | 5 | 0.4 | 0 |

SEMICONDUCTOR MEMORY DEVICE

CROSS-REFERENCE TO RELATED APPLICATION

The present application claims priority from Japanese Patent Application No. 2010-7751 filed on Jan. 18, 2010, the content of which is hereby incorporated by reference to this application.

TECHNICAL FIELD OF THE INVENTION

The present invention relates to a semiconductor memory device, and more particularly to a technology effectively applied to a semiconductor memory device having MONOS (Metal Oxide Nitride Oxide Semiconductor) memory cells each using a silicon nitride film or the like as a charge storage layer.

BACKGROUND OF THE INVENTION

As electrically writable/erasable nonvolatile semiconductor memory devices, an EEPROM (Electrical Erasable and Programmable Read Only Memory) and a flash memory has been currently used. Each memory cell in the nonvolatile semiconductor memory devices represented by the EEPROM and the flash memory has a charge storage region represented by a conductive floating gate electrode or a trapping insulating film surrounded by an oxide film under the gate electrode of a MIS (Metal Insulator Semiconductor) transistor, and charges are stored in the charge storage region as stored information and are read as the threshold voltage of the MIS transistor.

Examples of the memory cell having the trapping insulating film as the charge storage region include MONOS-type memory cells (hereinafter, simply referred to as MONOS memory cells). Among them, split-gate memory cells each having two gate electrodes of a memory gate electrode and a selection gate electrode have been widely used in recent years. The split-gate memory cell uses a trapping insulating film as a charge storage region, and is therefore capable of discretely storing charges therein and excellent in data retention reliability. In addition, because of the excellent data retention reliability, oxide films formed above and below the trapping insulating film can be thinned to provide the advantage of allowing reductions in the voltages for write/erase operations or the like. Also, the use of the split-gate memory cell allows hot electrons to be injected into the trapping insulating film by a SSI (Source Side Injection) method having high injection efficiency, and high-speed and low-current writing can be achieved. Moreover, because of easy control of write and erase operations, the advantage is also provided that a peripheral circuit can be scaled down. The trapping insulating film refers to an insulating film which enables charge storage. As an example of the trapping insulating film, a silicon nitride film can be shown.

Examples of a cell structure of the split-gate memory cell include that shown in FIG. 26, in which, after a selection gate electrode 6 is formed first, an ONO (Oxide Nitride Oxide) film including a lower oxide film 24, a silicon nitride film 25 and an upper oxide film 26 is formed, and a memory gate electrode 12 is formed in the shape of a sidewall spacer of the selection gate electrode 6 (see, for example, Japanese Unexamined Patent Application Publication 2005-123518 (Patent Document 1)).

An advantage of the split-gate memory cell is that, since the ONO film is present between the memory gate electrode 12 and the selection gate electrode 6, breakdown voltage is easily and reliably provided between the memory gate electrode 12 and the selection gate electrode 6, and the distance therebetween can be reduced to be almost as short as the thickness of the ONO film. When the distance between the memory gate electrode 12 and the selection gate electrode 6 can be reduced, the gap resistance of a channel portion under a region between the memory gate electrode 12 and the selection gate electrode 6 decreases, and a large read current can be obtained. Note that the reference numerals 1, 3, 16s and 16d in FIG. 26 denote a semiconductor substrate, a p-well, a source region and a drain region, respectively.

Patent Document 2 (Japanese Unexamined Patent Application Publication No. 2009-54707) discloses a technology which forms a bird's beak in an insulating film between a selection gate and a semiconductor substrate to increase the thickness of the insulating film at the end portion of the selection gate in the gate length direction thereof, thereby increasing a disturb life through the relaxation of an electric field.

SUMMARY OF THE INVENTION

In the case where writing by a SSI method is performed in a split-gate MONOS memory cell, the occurrence of disturb during writing is a problem. The disturb during writing mentioned here refers to a phenomenon in which, when a given one (selected memory cell) of a plurality of memory cells is selected and a write operation is performed to the selected memory cell, the voltage applied to the selected memory cell is also applied to a non-selected memory cell connected to the same line to perform weak write and erase operations to the non-selected memory cell, and data is gradually lost. In the writing by the SSI method, a high voltage is applied to both of a source line connected to the source regions of the plurality of memory cells and a memory gate line connected to the memory gate electrodes of the plurality of memory cells. Therefore, there is a non-selected memory cell in which the same high voltage as that under the write conditions is applied to both of the source region and the memory gate electrode, and a weak write phenomenon in which electrons are injected into the charge storage region occurs in the non-selected memory cell. When the speed of writing is increased with a source voltage Vs or a memory gate voltage Vmg, the disturb life is shortened, so that a trade-off relationship exists between an increase in the speed of writing and the disturb life. Therefore, the increase of disturb causes a problem in the split-gate and MONOS-type memory (hereinafter, simply referred to as the MONOS memory) in which writing is performed by the SSI method.

To solve the problem of disturb, a method can be considered in which the number of memory cells connected to the same source line and the same memory gate line is reduced. In this method, however, in order to prevent a reduction in the amount of storage capacity, it is necessary to divide one line into a plurality of lines and increase the number of drivers for driving the lines, and this undesirably increases the area occupied by a memory module.

An object of the present invention is to provide a semiconductor memory device in which the disturb resistance during the writing by a SSI method can be improved in split-gate memory cells.

The above and other objects and novel characteristics of the present invention will be apparent from the description of the present specification and the accompanying drawings.

The following is a brief description of an outline of the typical invention disclosed in the present application.

A semiconductor memory device according to one invention of the present application comprises: a nonvolatile memory cell having a first field effect transistor included in a first region of a main surface of a semiconductor substrate and a second field effect transistor included in a second region thereof and adjacent to the first field effect transistor.

The semiconductor memory device further comprises: a first gate electrode of the first field effect transistor formed in the first region; a second gate electrode of the second field effect transistor formed in the second region; and a gate insulating film formed between the semiconductor substrate and the first gate electrode. Furthermore, the semiconductor memory device comprises: a charge storage layer formed between the semiconductor substrate and the second gate electrode and between the first gate electrode and the second gate electrode; a first insulating film formed between the semiconductor substrate and the charge storage layer and between the first gate electrode and the charge storage layer; and a second insulating film formed between the charge storage layer and the second gate electrode.

In the semiconductor memory device according to one invention of the present application, a thickness of the second insulating film between the second gate electrode and the first gate electrode is larger than a thickness of the second insulating film between the second gate electrode and the semiconductor substrate.

The effects obtained by typical embodiments of the invention disclosed in the present application will be briefly described below.

The disturb resistance during writing can be improved in the semiconductor memory device. In addition, with the improvement in the disturb resistance of a non-selected memory cell, the reduction in the area occupied by a memory module can be achieved.

BRIEF DESCRIPTIONS OF THE DRAWINGS

FIG. 3 shows an example of conditions for voltages applied to respective lines during writing, erasing and reading to and from a selected cell according to the first embodiment of the present invention;

FIG. 4 shows an example of conditions for voltages applied to the respective terminals (selection gate lines, memory gate lines, source lines and bit lines) of the selected cell and non-selected cells when information is written in the selected cell according to the first embodiment of the present invention;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details or a supplementary explanation thereof.

Also, in the embodiments described below, when referring to the number of elements (including number of pieces, values, amount, range and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are not excluded except the case where it is particularly specified that A is the only element thereof.

Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical value and the range described above.

Still further, when the materials and the like are mentioned, the specified material is a main material unless otherwise stated or except the case where it is not so in principle or situationally, and the secondary components, additives, additional components and the like are not excluded. For example, a silicon material includes not only the case of pure silicon but also secondary and ternary alloys (for example, SiGe) and the like formed of additive impurities and silicon as the main component unless otherwise stated.

Also, components having the same function are denoted by the same reference symbols throughout the drawings for describing the embodiments, and the repetitive description thereof is omitted.

(First Embodiment)

Figure 1:
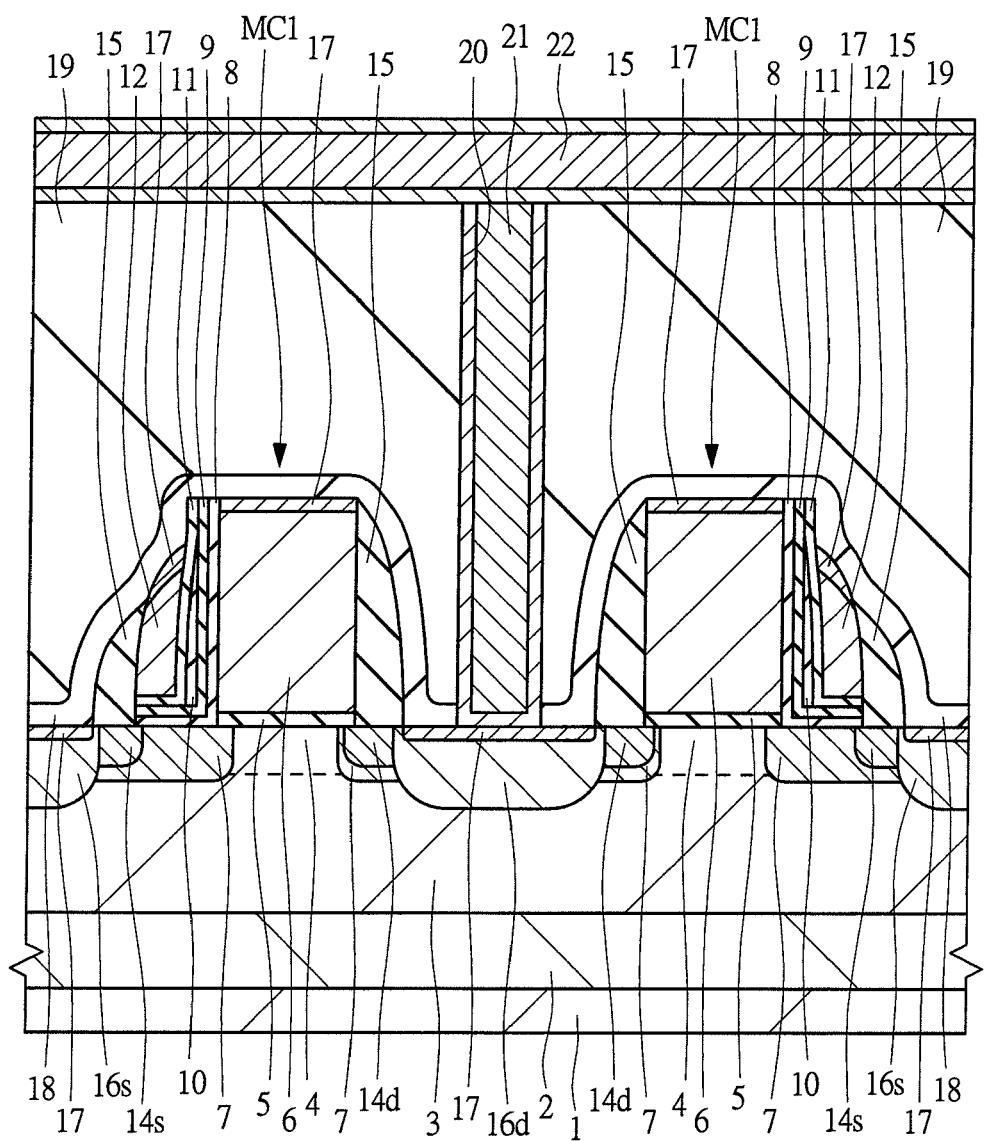
FIG. 1 is a cross-sectional view of the principal part of a semiconductor memory device according to the first embodiment of the present invention.

An example of a structure of a split-gate MONOS memory cell according to the first embodiment of the present invention will be described with reference to FIG. 1. FIG. 1 is a cross-sectional view of the principal part of the split-gate MONOS memory cells obtained by cutting the channels along a line crossing the memory gate electrodes.

As shown in FIG. 1, a semiconductor substrate 1 is made of, for example, p-type single-crystal silicon, and a p-well 3 containing a p-type impurity implanted therein is formed in an upper portion thereof. In an active region of a main surface (device formation surface) of the semiconductor substrate 1, an nMIS transistor for selecting a memory cell MC1 according to the first embodiment and an nMIS transistor for a memory purpose are disposed. The drain region and source region of each of the memory cells MC1 include relatively low-concentration $n^{-}$-type semiconductor regions 14d and 14s and relatively high-concentration $n^{+}$-type source and drain regions 16s and 16d whose impurity concentrations are higher than those of the $n^{-}$-type semiconductor regions 14d and 14s to have a LDD (Lightly Doped Drain) structure. The $n^{-}$-type semiconductor regions 14s and 14d are disposed close to the channel region of each of the memory cells MC1, and the $n^{+}$-type source and drain regions 16s and 16d are formed at positions away from the channel region of the memory cell MC1 by distances corresponding to the widths of the $n^{-}$-type semiconductor regions 14d and 14s in the gate length direction.

Over the main surface of the semiconductor substrate 1 between the semiconductor regions 14s and 14d, a selection gate electrode 6 of the above-described selection nMIS transistor and a memory gate electrode 12 of the above-described memory nMIS transistor extend adjacently, and in the extending direction thereof, the plurality of memory cells MC1 are adjacent to each other via element isolation portions (not shown) formed in the semiconductor substrate 1.

The selection gate electrode 6 is disposed in a first region of the main surface of the semiconductor substrate 1, and the memory gate electrode 12 is disposed in a second region of the main surface of the semiconductor substrate 1 different from the first region. The selection gate electrode 6 is made of, for example, an n-type polysilicon film, and it has an impurity concentration of, for example, about $2 \times 10^{20}$ $cm^{-3}$ and a gate length of, for example, about 100 to 150 nm. The selection gate electrode 6, the source region 16s and the drain region 16d form a first field effect transistor. Also, the memory gate electrode 12 is made of, for example, an n-type polysilicon film, and it has an impurity concentration of, for example, about $2 \times 10^{20}$ $cm^{-3}$ and a gate length of, for example, about 50 to 100 nm. The memory gate electrode 12, the source region 16s and the drain region 16d form a second field effect transistor.

On the upper surfaces of the selection gate electrode 6, the memory gate electrode 12, the source region 16s and the drain region 16d, silicide layers 17 made of, for example, cobalt silicide, nickel silicide, titanium silicide or the like are formed. In the MONOS memory cell, a potential needs to be supplied to both of the selection gate electrode 6 and the memory gate electrode 12, and the operation speed thereof largely depends on the resistance values of the selection gate electrode 6 and the memory gate electrode 12. Therefore, it is desirable to achieve the reduction in the resistance values of the selection gate electrode 6 and the memory gate electrode 12 by forming the silicide layers 17. The thickness of each of the silicide layers 17 is, for example, about 20 nm.

Between the selection gate electrode 6 and the main surface of the semiconductor substrate 1, a gate insulating film 5 made of a thin silicon oxide film having a thickness of, for example, about 1 to 5 nm is provided.

In the main surface of the semiconductor substrate 1 under the gate insulating film 5, a p-type semiconductor region 4 containing, for example, boron implanted therein is formed. The semiconductor region 4 is a semiconductor region for forming the channel of the selection nMIS transistor, and the threshold voltage of the selection nMIS transistor is set to a predetermined value by the semiconductor region 4.

The memory cell according to the first embodiment has a split-gate structure in which the memory gate electrode 12 is provided on one side surface of the selection gate electrode 6 and insulation between the selection gate electrode 6 and the memory gate electrode 12 is provided by an insulating film for charge retention obtained by stacking a lower-layer insulating film 8, a charge storage layer 9 and upper-layer insulating films 10 and 11.

The memory gate electrode 12 is disposed over the second region of the semiconductor substrate 1 via the insulating films 8 and 11 and the charge storage layer 9. Note that the insulating film 10 is formed between the side surface of the memory gate electrode 12 and the selection gate electrode 6, but is not formed between the lower surface of the memory gate electrode 12 and the semiconductor substrate 1. That is, the charge storage layer 9 is formed between the memory gate electrode 12 and the side surface of the selection gate electrode 6 and between the memory gate electrode 12 and the main surface of the semiconductor substrate 1, and the insulating film 11 is formed between the charge storage layer 9 and the memory gate electrode 12. Further, the insulating film 10 is formed between the charge storage layer 9 over the side surface of the selection gate electrode 6 and the insulating film 11 over the side surface of the memory gate electrode 12, and the insulating film 8 is formed between the charge storage layer 9 and the side surface of the selection gate electrode 6 and between the charge storage layer 9 and the main surface of the semiconductor substrate 1. The insulating film 8, the charge storage layer 9 and the insulating films 10 and 11 form an ONO film in the MONOS memory.

The charge storage layer 9 is formed to be interposed between the insulating film 8 and the insulating films 10 and 11. The member of the charge storage layer 9 is made of, for example, a silicon nitride film, and the thickness thereof is, for example, about 5 to 20 nm. The silicon nitride film is an insulating film having a discrete trap level therein and the function of storing charges at the trap level. The insulating films 8, 10 and 11 are each made of, for example, a silicon oxide film or the like. The thickness of the lower-layer insulating film 8 is, for example, about 1.5 to 6 nm, and the thicknesses of the upper-layer insulating films 10 and 11 are, for example, about 1 to 8 nm. Note that each of the insulating films 8, 10 and 11 can also be made of a silicon oxide film containing nitrogen.

In the main surface of the semiconductor substrate 1 located under the above-described lower-layer insulating film 8 and between the p-type semiconductor region 4 and the source region 16s, an n-type semiconductor region 7 containing, for example, arsenic or phosphorus implanted therein is formed. The semiconductor region 7 is a semiconductor region for forming the channel of the memory nMIS transistor, and the threshold voltage of the memory nMIS transistor is set to a predetermined value by the semiconductor region 7. Over the selection gate electrode 6 and the memory gate electrode 12, an interlayer insulating film including a silicon nitride film 18 and a silicon oxide film 19 is formed, and a contact hole 20 reaching the drain region 16d is formed in the interlayer insulating film. A first-layer wiring 22 extending in a second direction crossing the memory gate electrode 12 (or the selection gate electrode 6) extending in a first direction is connected to the drain region 16d via a plug 21 buried in the contact hole 20. The first-layer wiring 22 forms a bit line of each of the memory cells.

Figure 2:
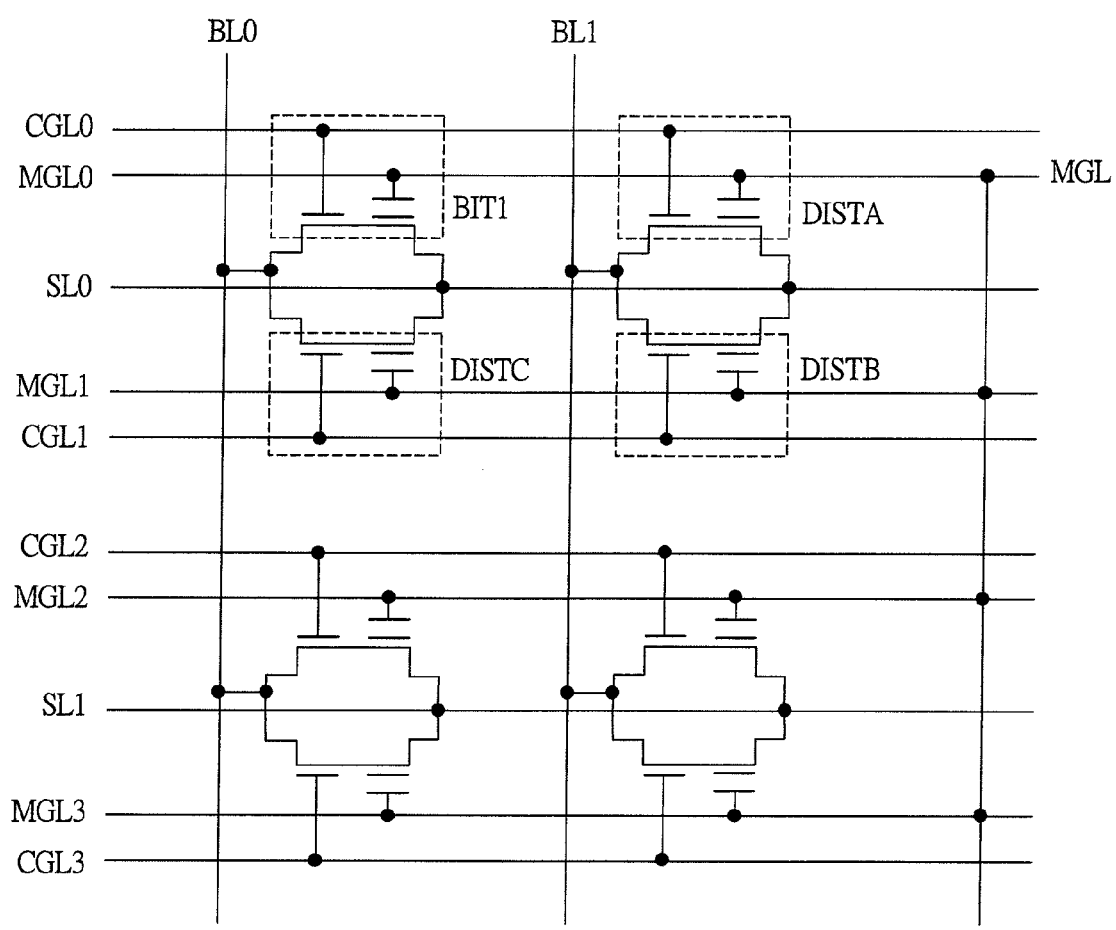
FIG. 2 is a circuit diagram showing an array structure of memory cells according to the first embodiment of the present invention.

Next, an example of the array structure of the split-gate MONOS memory cells described above will be described with reference to FIG. 2. FIG. 2 is a circuit diagram showing the array structure of the memory cells. Note that, in FIG. 2, for ease of illustration, only 2×4 memory cells are shown.

Selection gate lines (word lines) CGL0 to CGL3 connecting the selection gate electrodes 6 of the respective memory cells MC1, memory gate lines MGL0 to MGL3 connecting the memory gate electrodes 12 thereof and source lines SL0 and SL1 connecting the source regions each shared by the two adjacent memory cells extend in parallel with each other in the first direction. On the other hand, bit lines BL0 and BL1 connecting the drain regions of the respective memory cells extend in the second direction, that is, the direction orthogonal to the selection gate line CGL0 and the like. Note that these lines extend in the directions described above not only in the circuit diagram, but also in the layout of the respective memory cells MC1 shown in FIG. 1 and the lines. The selection gate line CGL0 or the like shown in FIG. 2 may also be formed of the selection gate electrode 6 or a line connected to the selection gate electrode 6.

In FIG. 2, a high voltage is applied during writing/erasing to the source lines SL0 and SL1 and the memory gate lines MGL0 to MGL3, so that a voltage boosting driver made up of a high-breakdown-voltage MIS transistor is connected thereto (not shown). On the other hand, only a low voltage of about 1.5 V is applied to the selection gate lines CLG0 to CGL3, so that a low-breakdown-voltage and high-speed voltage boosting driver is connected thereto (not shown). Sixteen, thirty-two or sixty-four memory cells are connected to each local bit line, and the local bit line is connected to a global bit line via a MIS transistor which selects the local bit line and the global bit line is connected to a sense amplifier.

In the array structure shown in FIG. 2, each of the source lines SL0 and SL1 is independently laid, and a plurality of the memory gate lines MGL0 to MGL3 are connected to each other to provide a common memory gate line MGL. However, it is also possible to connect a plurality of the source lines SL0 and SL1 to each other to provide a common source line and to connect a plurality of the memory gate lines MGL0 to MGL3 to each other to provide a common memory gate line. By providing the common lines, the number of high-breakdown-voltage drivers for driving the respective lines is reduced and a reduction in chip area can be achieved. Conversely, it is also possible to independently lay the source lines SL0 and SL1 and the memory gate lines MGL0 to MGL3. In this case, the number of the high-breakdown-voltage drivers increases, but a time during which disturb is received during writing and erasing can be reduced.

Figure 5:
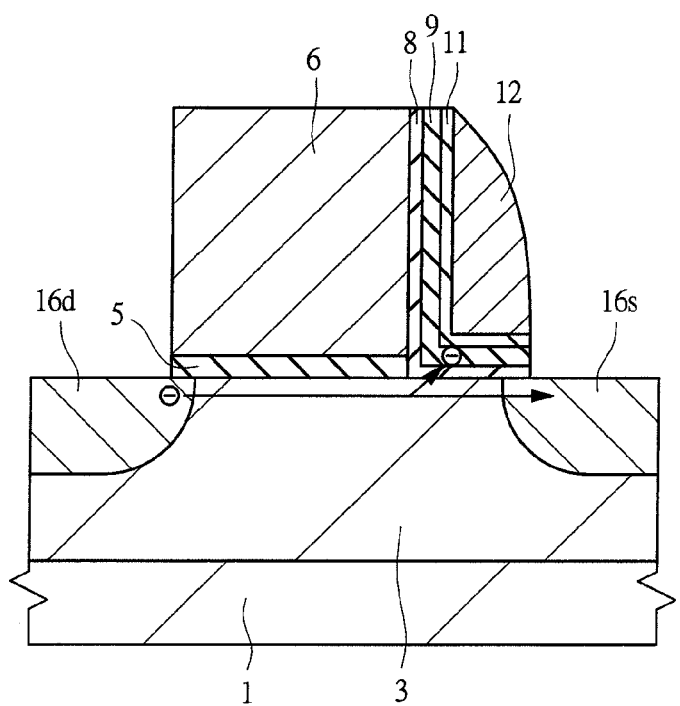
FIG. 5 is a cross-sectional view of the principal part showing the movement of charges in a write selected memory cell.

Next, an example of memory operations (writing, write disturb, erasing and reading) of the split-gate MONOS memory cell will be described with reference to FIGS. 3 to 5. FIG. 3 shows an example of conditions for voltages applied to the respective lines (the selection gate lines CGL0 to CGL3, the memory gate line MGL, the source lines SL0 and SL1, and the bit lines BL0 and BL1) during writing, erasing and reading to and from a selected cell BIT1 shown in FIG. 2. FIG. 4 shows an example of conditions for voltages applied to the respective terminals of the selected cell BIT1 and non-selected cells DISTA, DISTB and DISTC when information is written in the selected cell BIT1 shown in FIG. 2. FIG. 5 is a cross-sectional view of the principal part showing the movement of charges in a write selected memory cell. Here, the injection of electrons into the charge storage layer 9 is defined as "writing", and the injection of holes into the charge storage layer 9 is defined as "erasing".

First, the "erasing" will be described.

As shown in the "Erasing" section of FIG. 3, the erasing of information is performed by BTBT (Band-To-Band Tunneling) erasing in which holes are generated through a BTBT phenomenon and accelerated with an electric field to inject hot holes into the charge storage layer 9 or by FN (Fowler-Nordheim) erasing in which holes are injected from the memory gate electrode 12 or the semiconductor substrate 1 into the charge storage layer by FN tunneling.

In the case of performing the BTBT erasing, the voltage applied to the memory gate electrode is set to −6 V, the voltage applied to the source region is set to 6 V, and the voltage applied to the selection gate electrode is set to 0 V, and the drain region is brought into a floating state. To the p-well, 0 V is applied. When the voltages described above are applied, holes generated at the end portion of the source region by the voltage applied between the source region and the memory gate electrode through the BTBT phenomenon are accelerated by the high voltage applied to the source region to become hot holes. Then, the hot holes are attracted in the direction of the memory gate electrode by the high voltage applied to the memory gate electrode 12, and injected into the charge storage layer. The injected hot holes are trapped by a trap level in the charge storage layer 9, and the threshold voltage of the memory nMIS transistor lowers.

In the case of performing the FN erasing in which holes are injected from the memory gate electrode 12 shown in FIG. 1, in order to make FN tunneling injection of holes more likely to occur, the total thickness of the upper-layer insulating films 11 and 10 of the memory cell MC1 is preferably set 3 nm or less. Further, in the case of adopting a structure having the upper-layer insulating films 11 and 10, in order to make the hole injection easier, the upper-layer insulating film 11 is preferably designed to have a structure in which a silicon nitride film or an amorphous silicon film having a thickness of about 1 nm is inserted between two silicon oxide films.

As voltages applied for the FN erasing in which holes are injected from the memory gate electrode 12, the voltage applied to the memory gate electrode 12 is set to 15 V, and each of the voltage applied to the source region 16s, the voltage applied to the selection gate electrode 6, the voltage applied to the drain region 16d and the voltage applied to the p-well 3 is set to 0 V. When the voltages described above are applied, holes are injected from the memory gate electrode 12 into the charge storage layer 9 by FN tunneling. In addition, electrons stored in the charge storage layer 9 during writing are extracted to the memory gate electrode 12.

In the case of performing the FN erasing in which holes are injected from the semiconductor substrate 1, in order to make FN tunneling injection of holes more likely to occur, the thickness of the lower-layer insulating film 8 of the memory cell MC1 is set to 3 nm or less. Alternatively, in order to make the hole injection easier, the lower-layer insulating film 8 is designed to have a structure in which a silicon nitride film or an amorphous silicon film having a thickness of about 1 nm is inserted between two silicon oxide films. As voltages applied for the FN erasing in which holes are injected from the semiconductor substrate 1, the voltage applied to the memory gate electrode 12 is set to −15 V, and each of the other applied voltages, that is, the voltage applied to the source region 16s, the voltage applied to the selection gate electrode 6, the voltage applied to the drain region 16d and the voltage applied to the p-well 3 is set to 0 V. When the voltages described above are applied, holes are injected from the semiconductor substrate 1 into the charge storage layer 9 by tunneling. In addition, electrons stored in the charge storage layer 9 during writing are extracted to the semiconductor substrate 1.

Next, "writing" and "write disturb" will be described.

The writing of information is performed by a so-called SSI method. The non-selected cell DISTA shown in FIG. 2 is a memory cell connected to the memory gate line MGL, the source line SL0 and the selection gate line CGL0 to which the selected cell BIT1 is also connected, and the non-selected cells DISTB and DISTC are memory cells connected to the memory gate line MGL and the source line SL0 to which the selected cell BIT1 is also connected.

As shown in FIGS. 3 and 4, a voltage Vs applied to the source region of the selected cell BIT1 is set to 5 V, a voltage Vmg applied to the memory gate electrode is set to 9 V, and a voltage Vsg applied to the selection gate electrode is set to 1 V. Then, a voltage Vd applied to the drain region is controlled so that a channel current during writing has a given set value. The voltage Vd at this time is determined by the set value of the channel current and the threshold voltage of the selection MIS transistor, and becomes about 0.4 V when the set current value is, for example, 1 µA. A voltage Vwell applied to the p-well 3 is 0 V.

FIG. 5 shows the movement of charges when a write voltage is applied to the selected cell BIT1. By applying a voltage higher than that applied to the drain region 16d to the selection gate electrode 6 to bring the selection MIS transistor into an ON state and applying a positive high voltage to the source region 16s, electrons flow from the drain region 16d to the source region 16s. The electrons flowing in a channel region are accelerated in the channel region (between the source region 16s and the drain region 16d) under the vicinity of the boundary between the selection gate electrode 6 and the memory gate electrode 12 to become hot electrons. Then, the hot electrons are attracted to the memory gate electrode 12 by the positive voltage applied to the memory gate electrode 12, and injected into the charge storage layer 9 under the memory gate electrode 12. The injected hot electrons are trapped by the trap level in the charge storage layer 9, and consequently the electrons are stored in the charge storage layer 9 to raise the threshold voltage of the memory nMIS transistor.

As shown in FIG. 4, in the non-selected cell DISTA that receives write disturb, the voltage Vs applied to the source region is set to 5 V, the voltage Vmg applied to the memory gate electrode is set to 9 V, and the voltage Vsg applied to the selection gate electrode 1 V is set to 1 V, that is, the same voltages as those applied in the selected cell BIT1 are applied. The voltage Vd applied to the drain region is set to 1.5 V which is higher than the voltage Vsg applied to the selection gate electrode, unlike in the selected cell BIT1. The voltage higher than that applied to the selection gate electrode is applied to the drain region to bring the selection nMIS transistor into the OFF state, thereby inhibiting the writing.

In each of the non-selected cells DISTB and DISTC that receives write disturb, the voltage Vs applied to the source region is set to 5 V and the voltage Vmg applied to the memory gate electrode is set to 9 V, that is, the same voltages applied in the selected cell BIT1 are applied. The voltage Vsg applied to the selection gate electrode is set to 0 V for non-selection. As the voltage Vd applied to the drain region, 0.4 V is applied in the non-selected cell connected to the bit line BL0 to which the selected cell BIT1 is also connected, and 1.5 V is applied in the non-selected cell connected to the bit line BL1 different from that to which the selected cell BIT1 is connected. The voltage higher than the voltage Vsg applied to the selection gate electrode is applied to the drain region to bring the selection nMIS transistor into the OFF state, thereby inhibiting the writing.

Next, "reading" will be described.

As shown in the "reading" section of FIG. 3, reading is performed by two types of methods, that is, the method in which reading is performed by allowing a current to flow in a direction reverse to that for writing and the method in which reading is performed by allowing a current to flow in the same direction as that for writing. As shown in FIG. 3, in the case of performing the reading by allowing a current to flow in the direction reverse to that for writing, the voltage Vd applied to the drain region is set to 1 V, the voltage Vs applied to the source region is set to 0 V, the voltage Vsg applied to the selection gate electrode is set to 1.5 V, and the voltage Vmg applied to the memory gate electrode is set to 1.5 V. In the case of performing the reading by allowing a current to flow in the same direction as that for writing, the voltage Vd applied to the drain region and the voltage Vs applied to the source region are interchanged and set to 0 V and 1 V, respectively.

The voltage Vmg applied to the memory gate electrode during reading is set to a value between the threshold voltage of the memory nMIS transistor in a write state and the threshold voltage of the memory nMIS transistor in an erase state. When the threshold voltages in the write state and the erase state are set to 4 V and −1 V, respectively, the above-described voltage Vmg during reading has an intermediate value therebetween. By setting the voltage Vmg to the intermediate value, even if the threshold voltage in the write state lowers by 2 V during data retention or the threshold voltage in the erase state rises by 2 V, the write state and the erase state can be distinguished, so that the margin of a data retention characteristic increases. If the threshold voltage of the memory cell MC1 in the erase state is set sufficiently low, it is also possible to set the voltage Vmg during reading to 0 V. By setting the voltage Vmg during reading to 0 V, it is possible to avoid the read disturb, that is, fluctuations in threshold voltage due to the application of a voltage to the memory gate electrode.

Next, the principle of the occurrence of disturb and the characteristic of disturb will be described with reference to FIGS. 6 to 12.

Figure 6:
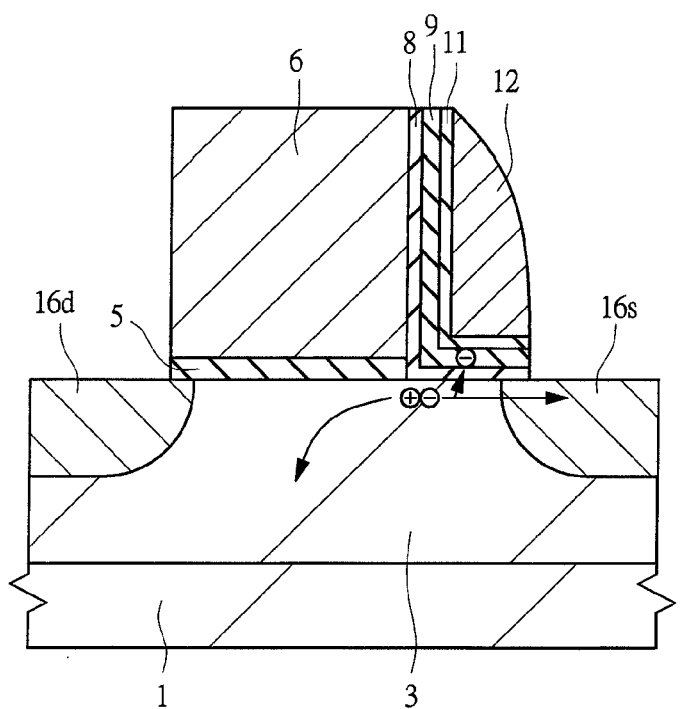
FIG. 6 is a cross-sectional view of the principal part of the memory cell for illustrating the mechanism of electron injection during disturb.

First, FIG. 6 shows a schematic diagram of the MONOS memory cell for illustrating the mechanism of electron injection into the charge storage layer during disturb. When the disturb voltages of FIG. 4 are applied, a positive voltage is applied to the memory gate electrode 12 and a channel region is formed under the memory gate electrode 12. Therefore, a high potential of 5 V applied to the source region 16s reaches the vicinity of the end portion of the selection gate electrode 6. Since a voltage higher than the voltage Vsg (1 V or 0 V) applied to the selection gate electrode 6 is applied to a region under the gate insulating film 5 under the end portion of the selection gate electrode 6 in the gate length direction thereof, a so-called GIDL (Gate Induced Drain Leakage) current flows. The GIDL current results from electron-hole pairs generated by BTBT in a part of the surface (semiconductor region 4 in FIG. 1) of the semiconductor substrate 1 located under a region between the selection gate electrode 6 and the memory gate electrode 12. The electrons in the electron-hole pairs are attracted by the positive high voltages applied to the source region 16s and the memory gate electrode 12 and injected into the charge storage layer 9, thereby causing the disturb.

With regard thereto, the inventor of the present invention has found that, when the thickness of the upper-layer insulating film 11 formed over the side surface of the memory gate electrode 12 is increased, the change rate of a disturb life is higher than the change rate of a write speed, and a memory characteristic is improved. This is because, while the mechanism of electron injection during writing is the SSI method, the mechanism of electron injection during disturb is the injection of carriers generated by BTBT. With regard to the probability of electron injection, the both mechanisms have the same electric field dependence, but with regard to a carrier density, since a BTBT occurrence rate exponentially depends on an electric field, the disturb life can be improved while suppressing the influence on the write speed by relaxing the electric field at a location where BTBT occurs. However, since the increase in the thickness of the insulating film between the memory gate electrode 12 and the substrate causes a reduction in electric field in the film thickness direction, it has a disadvantage of a lower erase speed.

The possible solution to the disadvantage is to increase only the thickness of the insulating film over the side surface of the memory gate electrode 12 within a range not affecting the erase speed without increasing the thickness of the insulating film under the memory gate electrode 12. In that event, there are two cases of increasing the thickness of the lower-layer insulating film 8 over the side surface of the memory gate electrode 12 as shown in FIG. 7A and increasing the thickness of the upper-layer insulating film 11 over the side surface of the memory gate electrode 12 as shown in FIG. 7B.

Figure 7A:
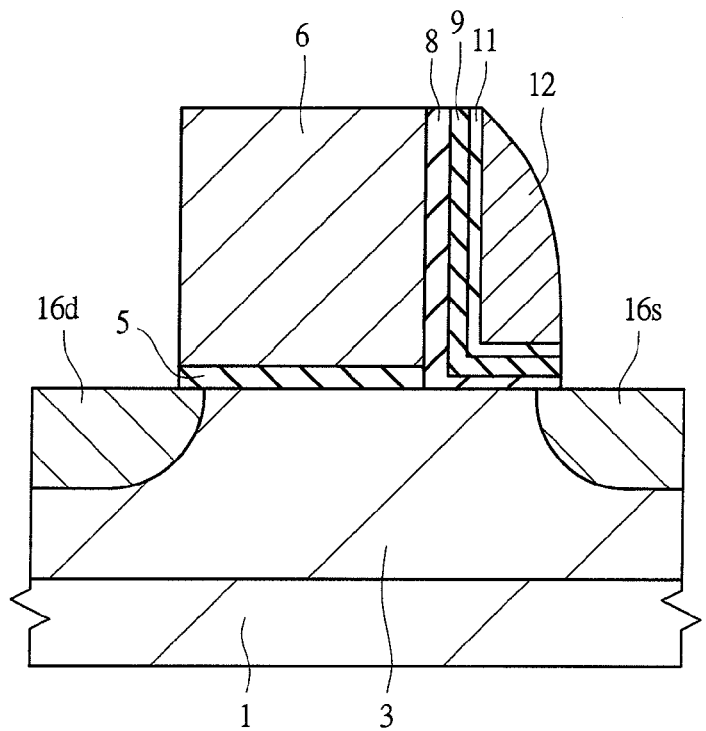
FIG. 7A is a cross-sectional view of the principal part showing a split-gate memory cell examined by the inventor of the present invention, in which the thickness of a lower-layer insulating film over the side surface of a memory gate electrode is increased.
Figure 7B:
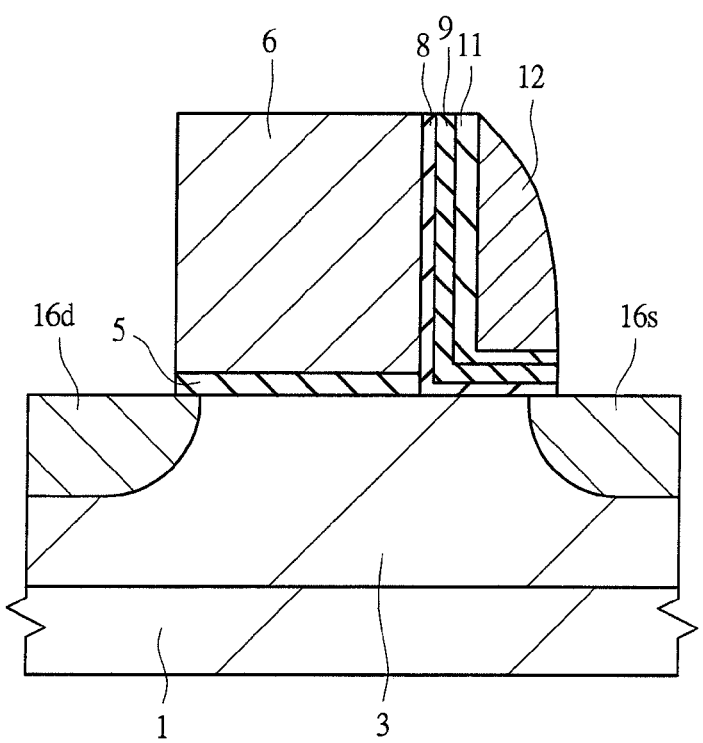
FIG. 7B is a cross-sectional view of the principal part showing a split-gate memory cell examined by the inventor of the present invention, in which the thickness of an upper-layer insulating film over the side surface of the memory gate electrode is increased.

Therefore, the inventor of the present invention has compared the dependence of the relationship between the write characteristic of the selected cell BIT1 and the disturb characteristic of the non-selected cell DISTA as an example of disturb on the thickness of the insulating film in the structure of FIG. 7A and that in the structure of FIG. 7B by device simulation. Here, the insulating films 8 and 11 formed between the side surface of the selection gate electrode 6 and the side surface of the memory gate electrode 12 are referred to as a side-surface lower-layer insulating film and a side-surface upper-layer insulating film, respectively.

Figure 8:
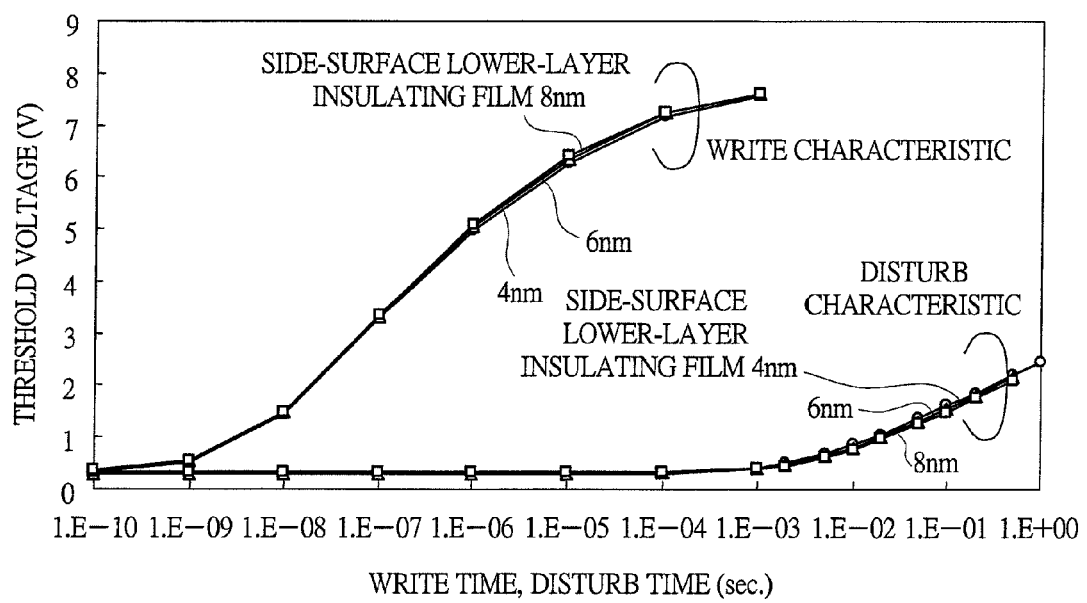
FIG. 8 is a graph showing the dependence of a write characteristic and a disturb characteristic on a side-surface lower-layer insulating film in the split-gate memory cell examined by the inventor of the present invention, in which the thickness of the lower-layer insulating film over the side surface of the memory gate electrode is increased.
Figure 9:
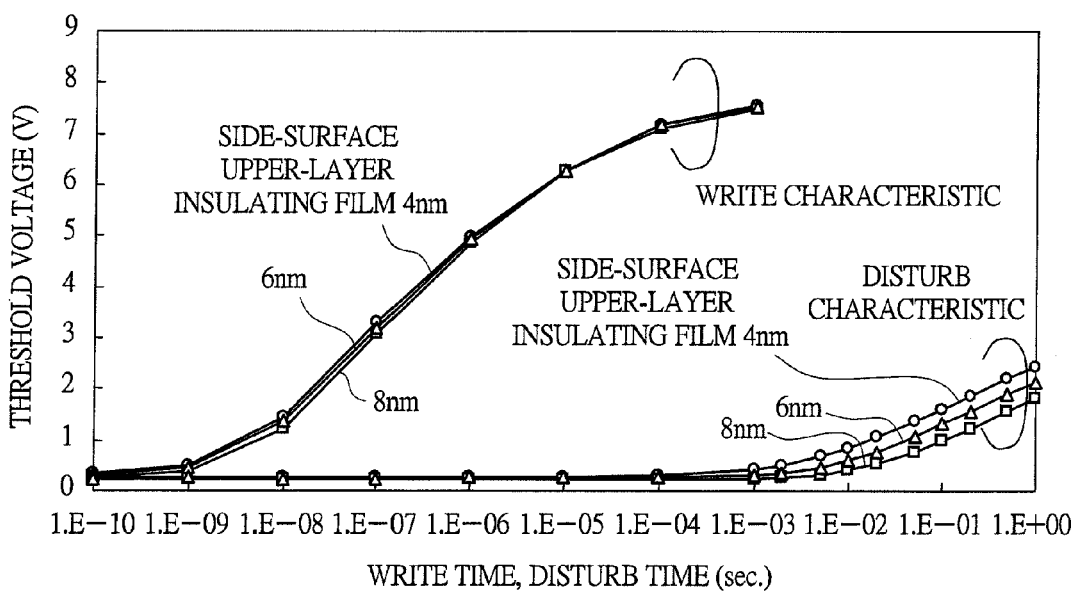
FIG. 9 is a graph showing the dependence of the write characteristic and the disturb characteristic on a side-surface upper-layer insulating film in the split-gate memory cell examined by the inventor of the present invention, in which the thickness of the upper-layer insulating film over the side surface of the memory gate electrode is increased.

FIG. 8 shows the write characteristic and the disturb characteristic of the memory cell shown in FIG. 7A, which correspond to the results in the case where the thickness of the side-surface upper-layer insulating film is fixed to 4 nm and the thickness of the side-surface lower-layer insulating film is varied to 4, 6 and 8 nm. FIG. 9 shows the write characteristic and the disturb characteristic of the memory cell shown in FIG. 7B, which correspond to the results in the case where the thickness of the side-surface lower-layer insulating film is fixed to 4 nm and the thickness of the side-surface upper-layer insulating film is varied to 4, 6 and 8 nm. As shown in FIGS. 8 and 9, the write characteristic hardly depends on the thickness of the side-surface lower-layer insulating film and the thickness of the side-surface upper-layer insulating film. By contrast, the disturb characteristic is improved only slightly when the thickness of the side-surface lower-layer insulating film is increased, but is greatly improved when the thickness of the side-surface upper-layer insulating film is increased.

Figure 10A:
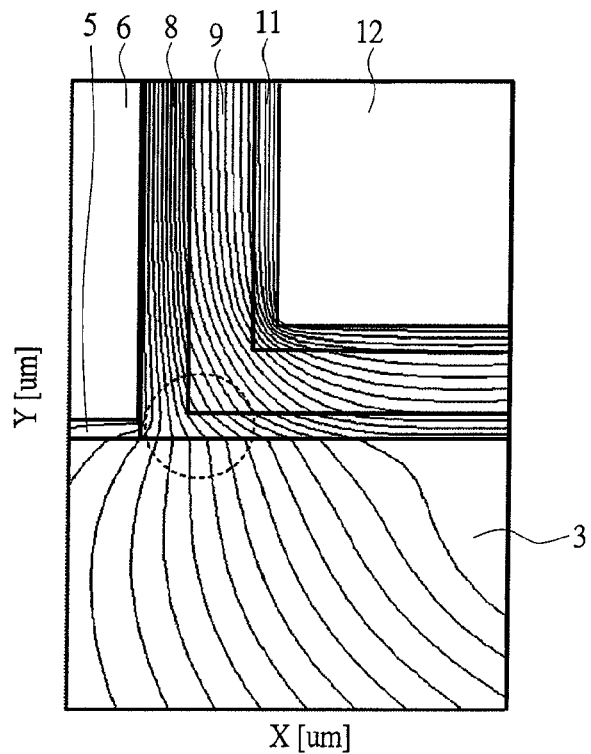
FIG. 10A is a graph showing the relationship between a write time and a disturb life when the thickness of the lower-layer insulating film over the side surface of the memory gate electrode is increased, which is examined by the inventor of the present invention.
Figure 10B:
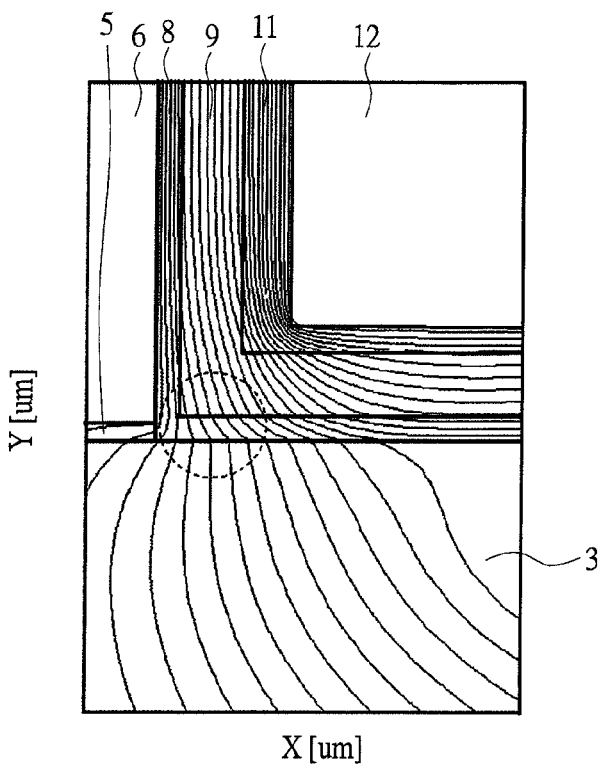
FIG. 10B is a graph showing the relationship between the write time and the disturb life when the thickness of the upper-layer insulating film over the side surface of the memory gate electrode is increased, which is examined by the inventor of the present invention.

Here, the reason for the difference observed between the respective disturb lives of the memory cells shown in FIGS. 7A and 7B will be described with reference to FIGS. 10A and 10B. FIGS. 10A and 10B show equipotential line distributions during disturb obtained by device simulation. FIG. 10A is a view showing a potential distribution in the case where the thickness of the side-surface upper-layer insulating film is set to 4 nm and the thickness of the side-surface lower-layer insulating film is set to 8 nm, and FIG. 10B is a view showing a potential distribution in the opposite case where the thickness of the side-surface upper-layer insulating film is set to 8 nm and the thickness of the side-surface lower-layer insulating film is set to 4 nm. Due to the difference in relative dielectric constant of the insulating film 8 (oxide film) and the charge storage film (nitride film), the electric field is larger in the insulating film 8 (oxide film) even in a flat portion between the selection gate electrode 6 and the memory gat electrode 12. The broken-line circular marks shown in FIGS. 10A and 10B indicate regions in the vicinity of the location where electron-hole pairs are generated by BTBT, and a difference is observed between FIGS. 10A and 10B. The spaces between equipotential lines in the insulating film 8 are narrower in FIG. 10A than in FIG. 10B. This shows that the electric field is larger in FIG. 10A, that is, the number of the electron-hole pairs generated by BTBT is larger in FIG. 10A. When the thickness of the side-surface lower-layer insulating film is increased, the electric field at the location where BTBT occurs receives the influence of the electric field in the side-surface lower-layer insulating film to cancel out the effect of the relaxation of the electric field due to the increase in film thickness. In the case of FIG. 10B, the effect of the relation of the electric field due to the increase in film thickness is large at the location where BTBT occurs partly because of the influence of the electric field in the nitride film.

For this reason, in the semiconductor memory device according to the first embodiment, information is written by injecting hot electrons into the charge storage layer by the SSI method, and information is erased by injecting hot holes into the charge storage layer by using the BTBT phenomenon.

Figure 11:
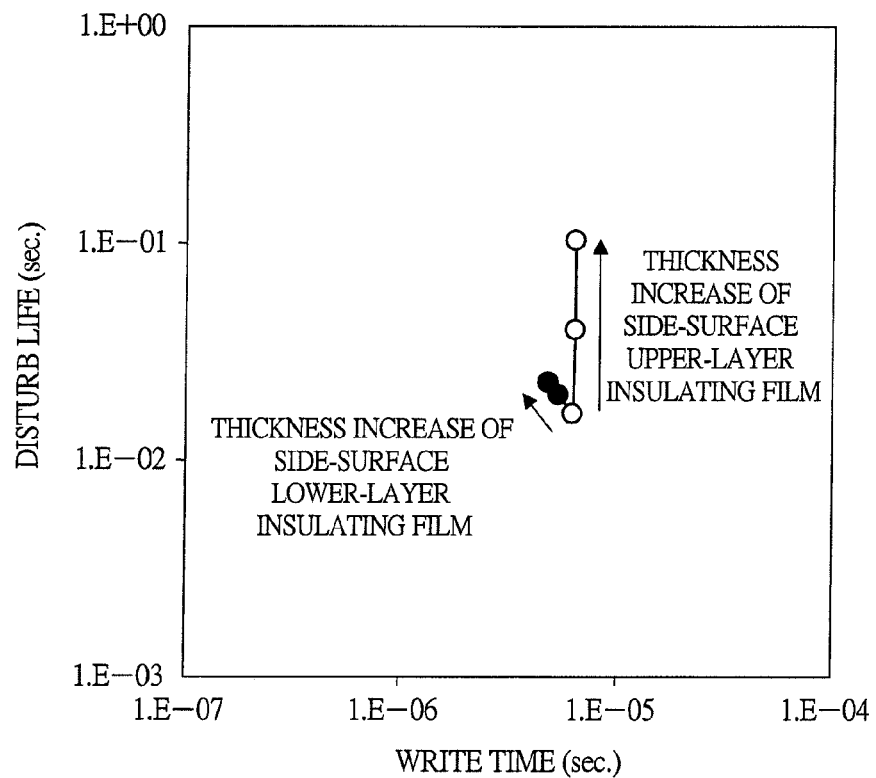
FIG. 11 is a graph showing the relationship between the disturb life and the write time when the lower-layer insulating film or the upper-layer insulating film over the side surface of the memory gate electrode is increased, which is examined by the inventor of the present invention.

FIG. 11 shows the result of plotting the relationship between the write time and the disturb life in each of the memory cells shown in FIGS. 10A and 10B. As the plotted point is positioned more leftward and upward in the graph of FIG. 11, the longer disturb life with the shorter write time (higher write speed) is obtained, and therefore it can be said that the disturb characteristic is improved. From FIG. 11, it can be understood that the effect of improving the disturb life is small when the thickness of the side-surface lower-layer insulating film is increased, but the effect of improving the disturb life is large when the thickness of the side-surface upper-layer insulating film is increased.

Figure 12:
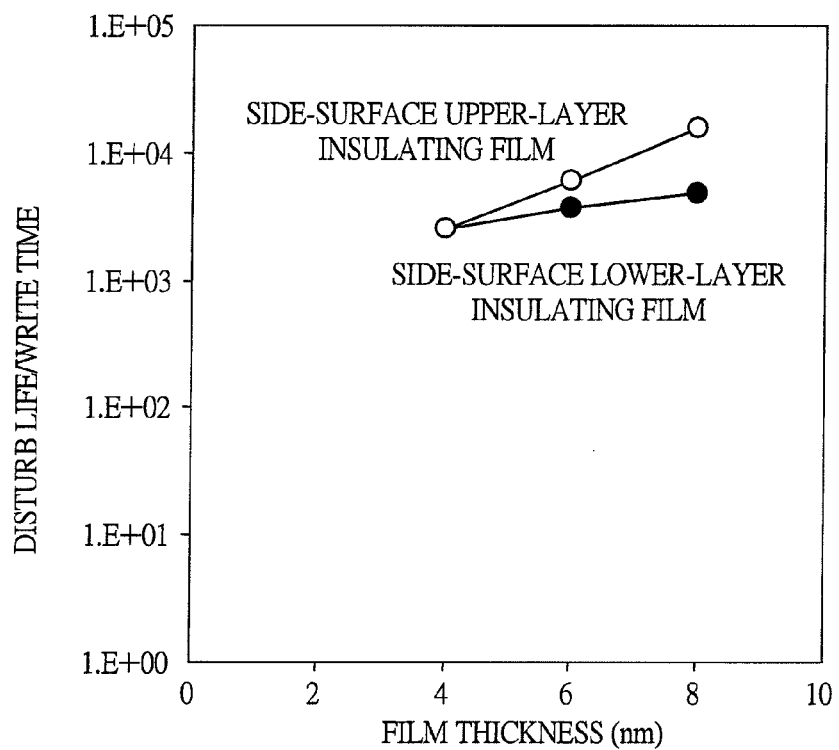
FIG. 12 is a graph showing the relationship between the ratio between the disturb life and the write time and the thickness of the lower-layer insulating film or the upper-layer insulating film over the side surface of the memory gate electrode, which is examined by the inventor of the present invention.

FIG. 12 shows the result of plotting the relationship between the thicknesses of the side-surface lower-layer insulating film and the side-surface upper-layer insulating film and the ratio between the disturb life and the write time. In FIG. 12, it can be said that the disturb characteristic is more improved as the plotted point is positioned more upward. From FIG. 12, it can be understood that the effect of improving the disturb life is small when the thickness of the side-surface lower-layer insulating film is increased, but the effect of improving the disturb life is large when the thickness of the side-surface upper-layer insulating film is increased.

From FIGS. 7 to 12, it can be understood that a larger effect of improving the disturb life is achieved when the thickness of the side-surface upper-layer insulating film is increased than when the thickness of the side-surface lower-layer insulating film is increased. Therefore, in the first embodiment, the total film thickness of a part of the insulating film 11 and the insulating film 10 between the selection gate electrode 6 and the memory gate electrode 12 is made larger than the film thickness of the insulating film 11 under the memory gate electrode 12 as shown in FIG. 1. Note that, in order to cover a general case where the insulating films 10 and 11 have different relative dielectric constants, when simply referring to the thickness of the insulating film having a multilayer structure of the insulating films 10 and 11 between the selection gate electrode 6 and the memory gate electrode 12, it does not indicate a physical thickness, but indicates an equivalent thickness calculated by converting the physical thickness thereof into that of a film having the relative dielectric constant of the insulating film 11.

Note that, if the thickness of the insulating film between the selection gate electrode 6 and the memory gate electrode 12 is excessively increased, the maximum transconductance of the memory nMIS transistor decreases to result in the disadvantage of a reduction in read current. This is because, as the distance between the selection gate electrode 6 and the memory gate electrode 12 is increased, a region unsusceptible to the influence of the voltages of the selection gate electrode 6 and the memory gate electrode 12 expands in the channel region under a region between the two electrodes and the resistance component of the channel region under the region between the two electrodes is increased.

Figure 13:
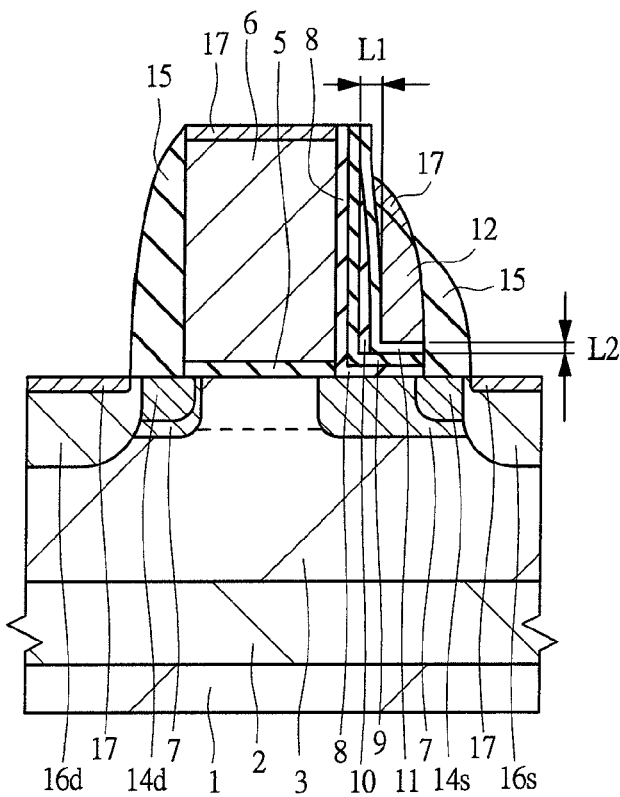
FIG. 13 is a cross-sectional view of the principal part of the memory cell according to the first embodiment of the present invention, in which the thickness of the upper-layer insulating film of the memory cell is defined.
Figure 14:
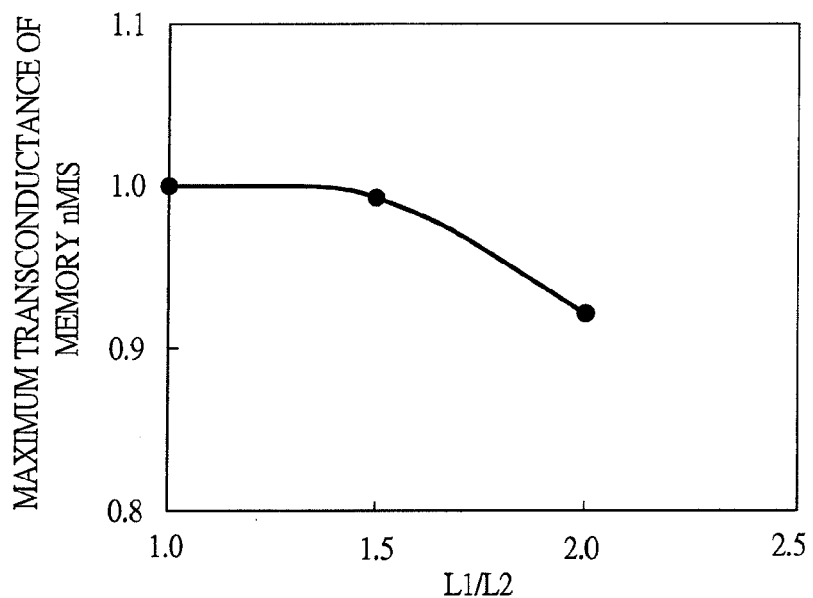
FIG. 14 is a graph showing the relationship between the thickness of an upper-layer insulating film over the side surface of a selection gate electrode and a maximum transconductance of a memory nMIS transistor according to the first embodiment of the present invention.

FIG. 13 is a schematic diagram of the MONOS memory cell according to the first embodiment, which shows the principal part of FIG. 1 in an enlarged manner. As shown in FIG. 13, the thickness of the upper-layer insulating film made up of the insulating films 10 and 11 over the side surface of the memory gate electrode 12 is denoted by L1, and the thickness of the upper-layer insulating film made up of the insulating film 11 under the memory gate electrode 12 is denoted by L2. Here, FIG. 14 shows the relationship between L1 and the maximum transconductance of the memory nMIS transistor obtained by device simulation. The abscissa axis of FIG. 14 represents the L1/L2 ratio, and the ordinate axis represents the maximum transconductance of the memory nMIS transistor. The maximum transconductance of the memory nMIS transistor shows that a larger read current can be obtained as the value of the maximum transconductance becomes larger, and the maximum transconductance is normalized to the value thereof when the L1/L2 ratio is 1. More specifically, it is assumed that the value of the maximum transconductance of the memory nMIS transistor is 1 when the L1/L2 ratio is 1.

As shown in FIG. 14, it can be understood that, when the L1/L2 ratio between the thickness (L1) of the upper-layer insulating film over the side surface of the memory gate electrode 12 and the thickness (L2) of the upper-layer insulating film under the memory gate electrode 12 is 1.5 or less, a large read current can be obtained without causing a reduction in transconductance. However, if the above-described L1/L2 ratio increases to more than 1.5, the transconductance decreases and the read current is significantly reduced. Therefore, in order to increase the disturb life while ensuring the read current, the thickness of a lower part of the upper-layer insulating film over the side surface of the memory gate electrode 12 needs to be 1.5 times or less the thickness of the upper-layer insulating film under the memory gate electrode 12.

As described above, in the split-gate MONOS memory cell, by setting the thickness of the upper-layer insulating film over the side surface of the memory gate electrode to a value larger than the thickness of the upper-layer insulating film under the memory gate electrode, the occurrence of disturb in the non-selected memory cell can be prevented.

In the first embodiment, by providing the insulating film 10 between the charge storage layer 9 and the insulating film 11 between the selection gate electrode 6 and the memory gate electrode 12 as shown in FIG. 1, the upper-layer insulating film made up of the insulating films 10 and 11 formed over the side surface of the memory gate electrode 12 is formed thicker than the upper-layer insulating film made up of the insulating film 11 under the memory gate electrode 12. At this time, the total thickness of the insulating films 10 and 11 is set to be 1.5 times or less the thickness of the insulating film 11 as shown in FIG. 1. In this manner, in the split-gate MONOS memory cell in the first embodiment, the disturb resistance of the non-selected memory cell can be improved.

Further, when the respective physical thicknesses of the insulating films 10 and 11 are set to T1 and T2, a T1/T2 ratio can be defined from the relative dielectric constants of the respective members of the insulating films 10 and 11. More specifically, when the respective relative dielectric constants of the insulating films 11 and 10 are set to e1 and e2, since the thickness L1 of the upper-layer insulating film over the side surface of the memory gate electrode 12 is T1 (e2/e1)+T2, it is sufficient that the physical thickness T1 of the insulating film 10 be (e2/e1)·0.5 times or less the physical thickness T2 of the insulating film 11 between the memory gate electrode 12 and the semiconductor substrate 1.

Next, an example of a manufacturing method of the split-gate MONOS memory cell according to the first embodiment of the present invention will be described with reference to FIGS. 15 to 23. FIGS. 15 to 23 are cross-sectional views of the principal part of the memory cell in the manufacturing process of the semiconductor memory device, and they show the same portion as the cross-sectional view of the principal part of the memory cell shown in FIG. 1.

Figure 15:
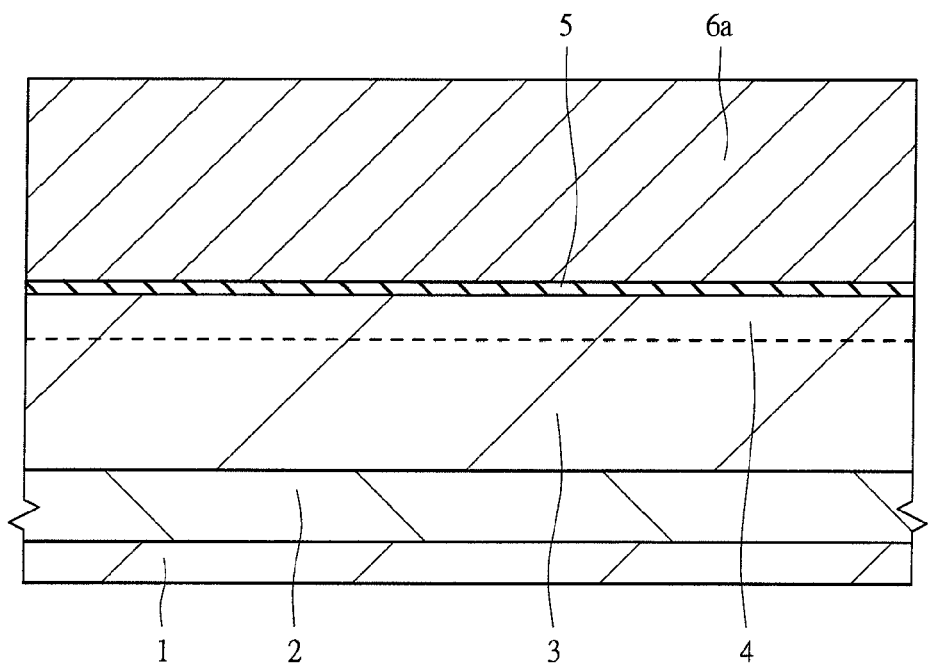
FIG. 15 is a cross-sectional view of the principal part illustrating a manufacturing method of the semiconductor memory device according to the first embodiment of the present invention.

First, as shown in FIG. 15, the semiconductor substrate (at this stage, a thin plate referred to as a semiconductor wafer having a generally circular plan shape and made of semiconductor) 1 made of p-type single-crystal silicon having a specific resistance of, for example, about 1 to 10 Ω·cm is prepared. Subsequently, in the main surface of the semiconductor substrate 1, for example, a trench-type element isolation portion (not shown), active regions disposed so as to be surrounded thereby and the like are formed. More specifically, after an isolation trench is formed in the element isolation formation region of the main surface of the semiconductor substrate 1, an insulating film made of, for example, a silicon oxide film is formed on the main surface of the semiconductor substrate 1. Then, the insulating film is polished by a CMP (Chemical Mechanical Polishing) method or the like till the main surface of the semiconductor substrate 1 is exposed so that the insulating film is left only in the isolation trench, thereby forming the element isolation portion.

Next, predetermined impurities are selectively implanted into predetermined portions of the semiconductor substrate 1 with predetermined energies by an ion implantation method or the like to form a buried n-well 2 and the buried p-well 3. Subsequently, a p-type impurity, for example, boron is ion-implanted into the main surface of the semiconductor substrate 1 to form the p-type semiconductor region 4 for forming the channels of the selection nMIS transistors. At this time, the energy for implanting the p-type impurity ions is, for example, about 20 KeV, and a dosage thereof is, for example, about $1.5 \times 10^{13}$ cm$^{-2}$.

Next, a thermal oxidation treatment is performed to the semiconductor substrate 1 to form the gate insulating film 5 made of, for example, a silicon oxide film and having a thickness of about 1 to 5 nm over the main surface of the semiconductor substrate 1. Subsequently, over the main surface of the semiconductor substrate 1, a first conductive film 6a made of a polysilicon film having an impurity concentration of, for example, about $2 \times 10^{20}$ cm$^{-3}$ is deposited. The first conductive film 6a is formed by a CVD (Chemical Vapor Deposition) method, and the thickness of about 150 to 250 nm can be illustrated as an example of the thickness thereof.

Figure 16:
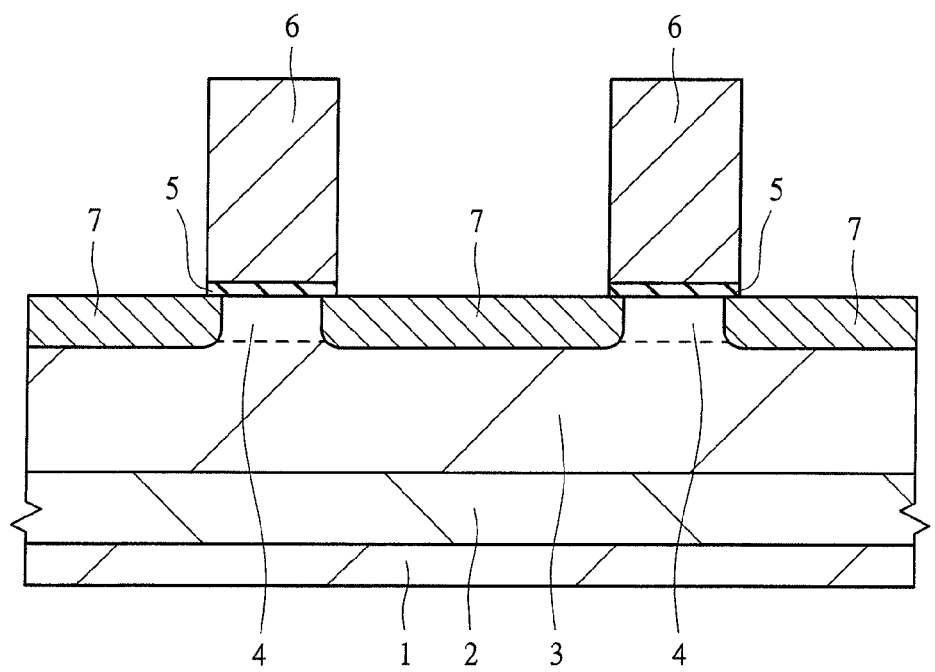
FIG. 16 is a cross-sectional view of the principal part illustrating the manufacturing method of the semiconductor memory device continued from FIG. 15.

Next, as shown in FIG. 16, the first conductive film 6a is processed by etching using a resist pattern as a mask to form the selection gate electrodes 6 each made of the first conductive film 6a. The gate length of the selection gate electrode 6 is, for example, about 100 to 150 nm. The selection gate electrodes 6 are in a linear pattern extending in the depth direction of the drawing. This pattern corresponds to, for example, the selection gate lines CGL0 to CGL3 in the array structure of the memory cells shown in FIG. 2. Subsequently, the exposed gate insulating film 5 is removed with, for example, an aqueous hydrofluoric acid solution.

Then, an n-type impurity, for example, arsenic or phosphorus is ion-implanted into the main surface of the semiconductor substrate 1 with using the selection gate electrodes 6 and the resist pattern as a mask to form the n-type semiconductor regions 7 for forming the channels of the memory nMIS transistors. At this time, the energy for implanting the n-type impurity ions is, for example, about 25 keV, and a dosage thereof is, for example, about $6.5 \times 10^{12}$ cm$^{-2}$.

Figure 17:
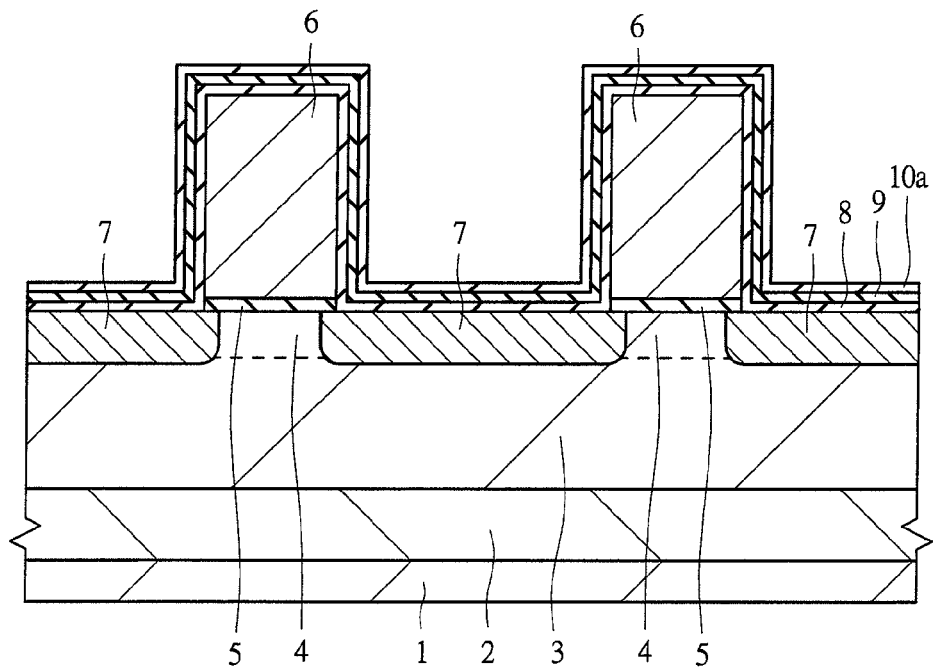
FIG. 17 is a cross-sectional view of the principal part illustrating the manufacturing method of the semiconductor memory device continued from FIG. 16.

Next, as shown in FIG. 17, the lower-layer insulating film 8 made of, for example, a silicon oxide film, the charge storage layer 9 made of, for example, a silicon nitride film and an upper-layer insulating film 10a made of, for example, a silicon oxide film are sequentially deposited over the main surface of the semiconductor substrate 1. The insulating film 8 is formed by an ISSG (In-Situ Stream Generation) oxidation method, and the thickness thereof is, for example, about 1.5 to 6 nm. The charge storage layer 9 is formed by a CVD method, and the thickness thereof is, for example, about 5 to 20 nm. The insulating film 10a is formed by an ISSG oxidation method or a CVD method, and the thickness thereof is, for example, about 1 to 3 nm.

Figure 18:
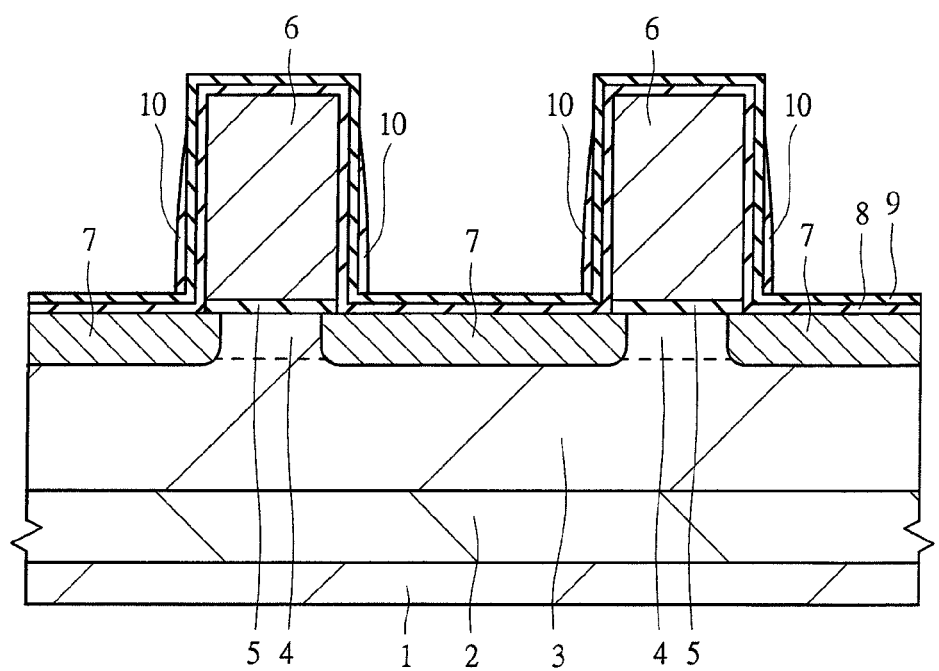
FIG. 18 is a cross-sectional view of the principal part illustrating the manufacturing method of the semiconductor memory device continued from FIG. 17.

Next, as shown in FIG. 18, the insulating film 10a is etched back by a dry etching method to leave the insulating films 10 each made of the insulating film 10a as sidewalls only over the side surfaces of the charge storage layer 9 over the side surfaces of the selection gate electrodes 6. At this time, since the insulating films 10 are etched back with using the charge storage layer 9 as an etching stopper, in order to prevent the charge storage layer 9 from being damaged and impaired by the etch-back process, it is desirable to set low-damage etching conditions.

Figure 19:
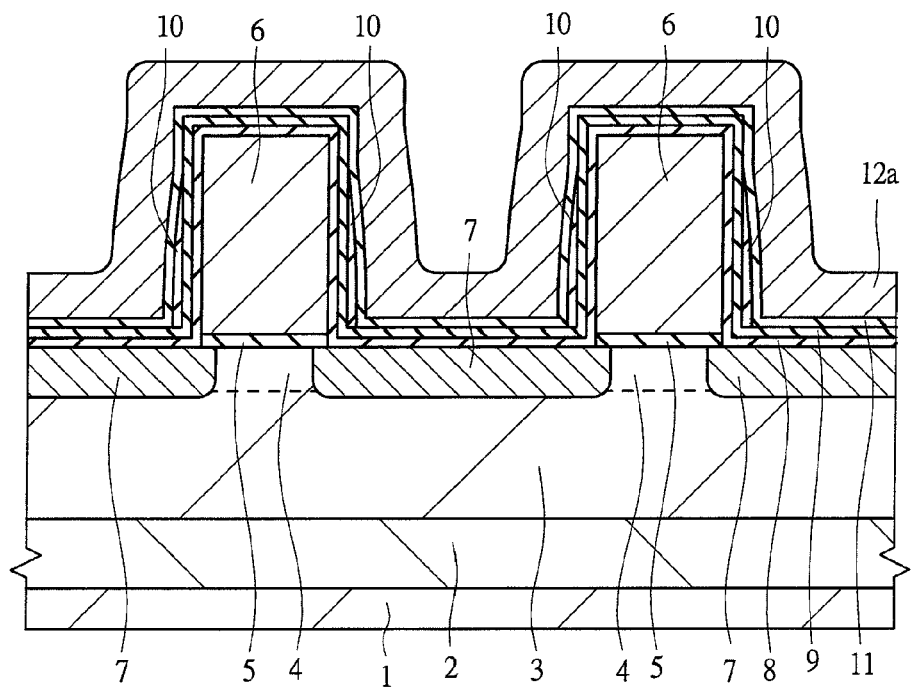
FIG. 19 is a cross-sectional view of the principal part illustrating the manufacturing method of the semiconductor memory device continued from FIG. 18.

Next, as shown in FIG. 19, the upper-layer insulating film 11 made of, for example, a silicon oxide film is formed. The insulating film 11 is formed by an ISSG oxidation method or a CVD method, and the thickness of about 4 to 6 nm can be illustrated as an example of the thickness thereof. Note that the insulating film 11 is formed to have twice or more the thickness of the insulating film 10.

As the member of each of the insulating films 10 and 11, a silicon oxynitride film or the like can be used besides a silicon oxide film. However, when the insulating films 10 and 11 are formed of different types of materials, charges are trapped at the interface between the insulating films 10 and 11. Therefore, the insulating films 10 and 11 are desirably formed of the films made of the same type of member. More specifically, when a silicon oxide film is used for the insulating film 11, the silicon oxide film is used also for the insulating film 10, and when a silicon oxynitride film is used for the insulating film 11, the silicon oxynitride film is used also for the insulating film 10.

Note that, since the configurations of respective films forming the insulating films 8, 10 and 11 and the charge storage layer 9 vary depending on the method of using the semiconductor memory device to be manufactured, only the representative configurations and values are shown herein as examples, but the configurations and values are not limited to those shown above.

Next, a second conductive film 12a made of a polysilicon film having an impurity concentration of, for example, about $2 \times 10^{20}$ cm$^{-3}$ is deposited over the main surface of the semiconductor substrate 1. The second conductive film 12a is formed by a CVD method, and the thickness of about 50 to 100 nm can be illustrated as an example of the thickness thereof.

Figure 20:
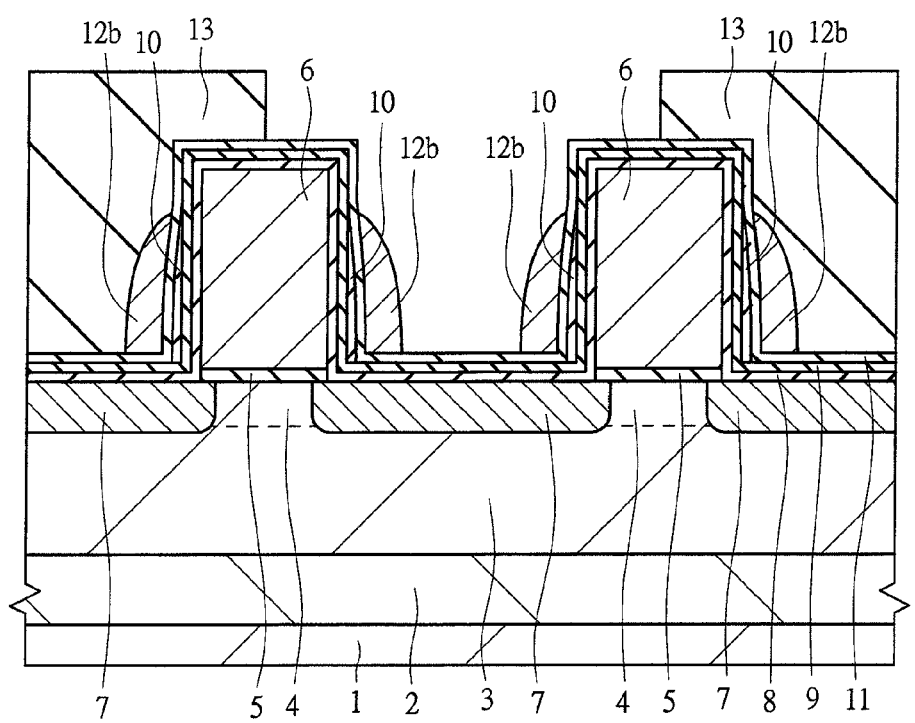
FIG. 20 is a cross-sectional view of the principal part illustrating the manufacturing method of the semiconductor memory device continued from FIG. 19.

Next, as shown in FIG. 20, the above-described second conductive film 12a is etched back by a dry etching method to form sidewalls 12b each made of the second conductive film 12a over the both side surfaces of the selection gate electrodes 6 via the insulating films 8, 10 and 11 and the charge storage layer 9. Thereafter, though the illustration thereof is omitted, the second conductive film 12a is processed with using a resist pattern as a mask to form a lead-out portion in a region where a contact hole to be connected to the memory gate electrode 12 is formed afterward. Furthermore, in the step of forming the sidewalls 12b, since the second conductive film 12a is etched back with using the upper-layer insulating film 11 as an etching stopper layer, in order to prevent the upper-layer insulating film 11 and the charge storage layer 9 thereunder from being damaged and impaired by the etch-back process, it is desirable to set low-damage etching conditions.

Then, over the main surface of the semiconductor substrate 1 except for a region from the upper portion of the selection gate electrode 6 to the upper portion of the adjacent selection gate electrode 6, a resist pattern 13 is formed so as to cover the respective surfaces of the insulating film 11 and the sidewalls 12b. In other words, the resist pattern 13 is formed so as to cover one of the sidewall 12b and not to cover the other sidewall 12b out of the sidewalls 12b formed over the both side surfaces of each of the selection gate electrodes 6.

Figure 21:
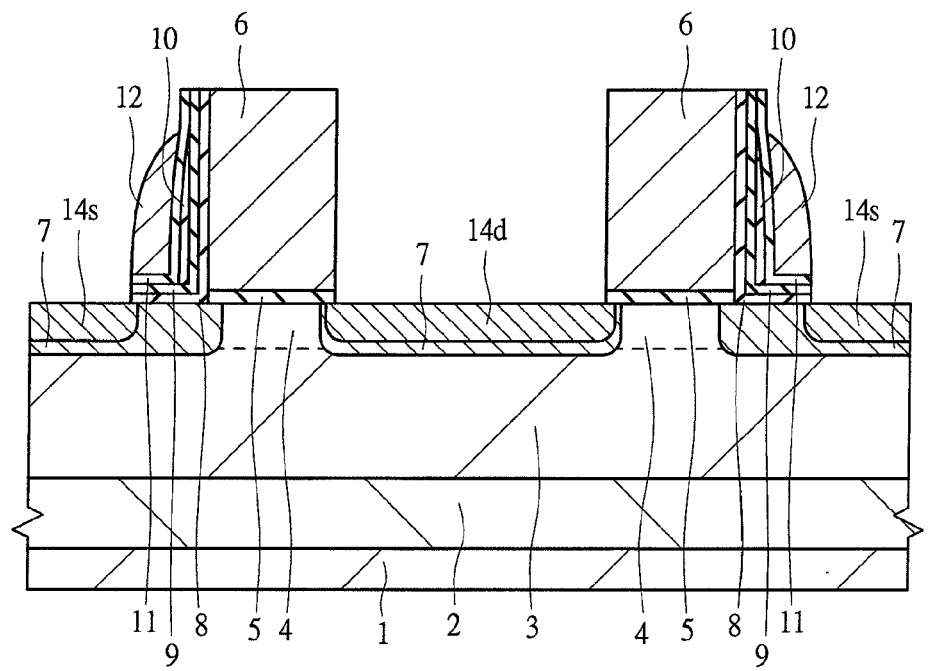
FIG. 21 is a cross-sectional view of the principal part illustrating the manufacturing method of the semiconductor memory device continued from FIG. 20.

Next, as shown in FIG. 21, the sidewalls 12b exposed from the resist pattern 13 are etched with using the resist pattern 13 as a mask to form the memory gate electrodes 12 made of the sidewalls 12b only over the respective one side surfaces of the selection gate electrodes 6. The gate length of each of the memory gate electrodes 12 is, for example, about 50 to 100 nm. Thereafter, the resist pattern 13 is removed, and the respective portions of the insulating films 8, 10 and 11 and the charge storage layer 9 located between the selection gate electrodes 6 and the memory gate electrodes 12 and between the semiconductor substrate 1 and the memory gate electrodes 12 are left, and the respective portions thereof located in the other region are selectively etched to be removed.

Next, a resist pattern is formed, which covers the main surface of the semiconductor substrate 1 between the side surface of the selection gate electrode 6 where the memory gate electrode 12 is not formed and the side surface of the selection gate electrode 6 opposed thereto. Thereafter, an n-type impurity, for example, arsenic is ion-implanted into the main surface of the semiconductor substrate 1 with using the selection gate electrodes 6, the memory gate electrodes 12 and the resist pattern as a mask to form the $n^-$-type semiconductor regions 14s in the main surface of the semiconductor substrate 1 in a self-alignment manner with respect to the memory gate electrodes 12, and then the resist pattern is removed. At this time, the energy for implanting the impurity ions is, for example, about 5 keV, and a dosage thereof is, for example, about $1 \times 10^{15}$ cm$^{-2}$.

Next, a resist pattern is formed, which covers the main surface of the semiconductor substrate 1 between the side surface of the selection gate electrode 6 where the memory gate electrode 12 is formed and the side surface of the selection gate electrode 6 opposed thereto. Thereafter, an n-type impurity, for example, arsenic is ion-implanted into the main surface of the semiconductor substrate 1 with using the selection gate electrodes 6, the memory gate electrodes 12 and the above-described resist pattern as a mask to form the $n^-$-type semiconductor region 14d in the main surface of the semiconductor substrate 1 in a self-alignment manner with respect to the selection gate electrodes 6, and then the resist pattern is removed. At this time, the energy for implanting the n-type impurity ions is, for example, about 7 keV, and a dosage thereof is, for example, about $1 \times 10^{15}$ cm$^{-2}$.

Here, the $n^-$-type semiconductor regions 14s are formed first and then the $n^-$-type semiconductor region 14d is formed. However, it is also possible to form the $n^-$-type semiconductor region 14d first and then form the $n^-$-type semiconductor regions 14s. Alternatively, the $n^-$-type semiconductor regions 14s and 14d may be simultaneously formed. Furthermore, it is also possible to form a p-type semiconductor region so as to surround the lower portions of the $n^-$-type semiconductor regions 14s and 14d by performing the ion implantation of a p-type impurity, for example, boron into the main surface of the semiconductor substrate 1 after the ion implantation of the n-type impurity for forming the $n^-$-type semiconductor region 14d. The energy for implanting the p-type impurity ions is, for example, about 20 keV, and a dosage thereof is, for example, about $2.5 \times 10^{13}$ cm$^{-2}$.

Figure 22:
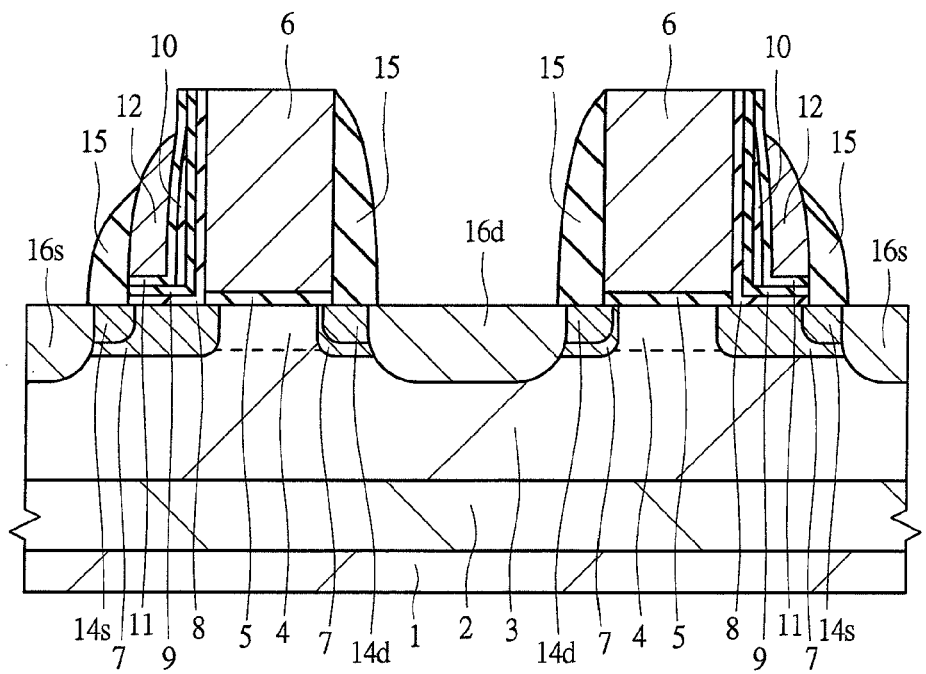
FIG. 22 is a cross-sectional view of the principal part illustrating the manufacturing method of the semiconductor memory device continued from FIG. 21.

Next, as shown in FIG. 22, an insulating film made of, for example, a silicon oxide film and having a thickness of about 80 nm is deposited over the main surface of the semiconductor substrate 1 by a CVD method. Then, the insulating film is etched back by a dry etching method to form sidewalls 15 over the respective one side surfaces of the selection gate electrodes 6 and the respective one side surfaces of the memory gate electrodes 12. The spacer length of each of the sidewalls 15 in the gate length direction of the selection gate electrodes 6 is, for example, about 60 nm. In this manner, the exposed side surfaces of the gate insulating films 5 between the selection gate electrodes 6 and the semiconductor substrate 1 and the exposed side surfaces of the insulating films 8 and 11 and the charge storage layers 9 between the memory gate electrodes 12 and the semiconductor substrate 1 can be covered with the sidewalls 15.

Next, n-type impurities, for example, arsenic and phosphorus are ion-implanted into the main surface of the semiconductor substrate 1 with using the sidewalls 15 as a mask to form the source regions 16s and the drain region 16d that are $n^+$-type semiconductor regions in the main surface of the semiconductor substrate 1 in a self-alignment manner with respect to the selection gate electrodes 6 and the memory gate electrodes 12. At this time, the energy for implanting the n-type impurity ions is, for example, about 50 keV, and a dosage thereof is, for example, about $4 \times 10^{15}$ cm$^{-2}$. Also, the energy for implanting the phosphorus ions is, for example, about 40 keV, and a dosage thereof is, for example, about $5 \times 10^{13}$ cm$^{-2}$. In this manner, the drain region including the $n^-$-type semiconductor regions 14d and the $n^+$-type drain region 16d and the source regions including the $n^-$-type semiconductor regions 14s and the $n^+$-type source regions 16s are formed.

Figure 23:
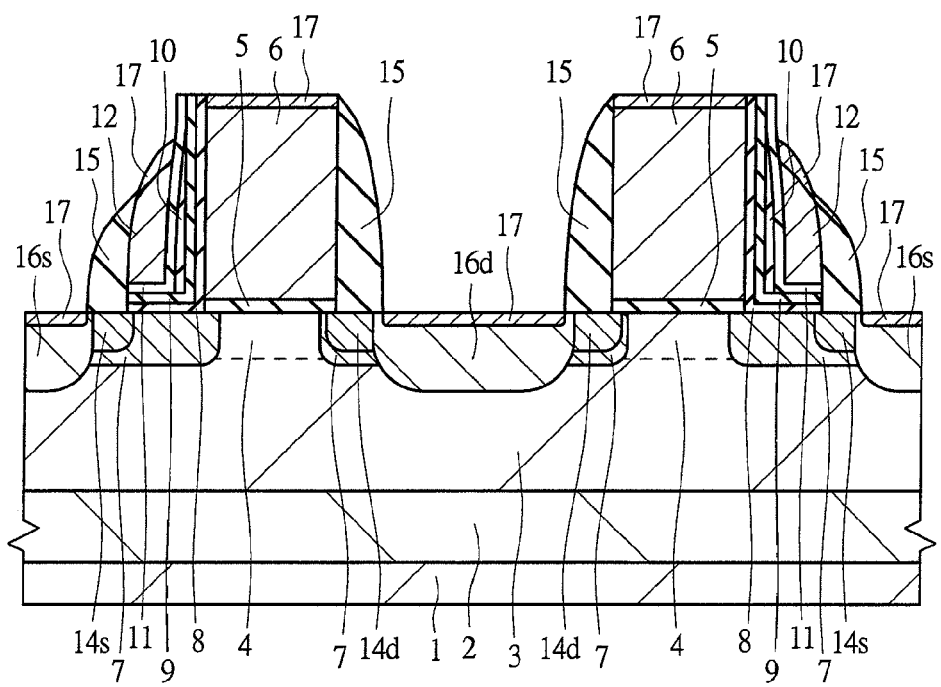
FIG. 23 is a cross-sectional view of the principal part illustrating the manufacturing method of the semiconductor memory device continued from FIG. 22.

Next, as shown in FIG. 23, on the upper surfaces of the selection gate electrodes 6 and the memory gate electrodes 12 and on the upper surfaces of the $n^+$-type source regions 16s and the drain region 16d, the silicide layers 17 made of, for example, cobalt silicide (CoSi$_2$) are formed by a self-alignment method, for example, a Self Align silicide (Salicide) process. First, over the main surface of the semiconductor substrate 1, a cobalt film is deposited by a sputtering method. Subsequently, a thermal treatment using a RTA (Rapid Thermal Anneal) method is performed to the semiconductor substrate 1 to cause reactions between the cobalt film and the respective polysilicon films forming the selection gate electrodes 6 and the memory gate electrodes 12 and between the cobalt film and the single-crystal silicon forming the semiconductor substrate 1 (the $n^+$-type source regions 16s and drain region 16d), thereby forming the silicide layers 17 made of cobalt silicide. Thereafter, the unreacted cobalt film is removed. By forming the silicide layers 17, the contact resistances between the silicide layers 17 and a plug formed thereon and the like can be reduced, and the resistances of the selection gate electrodes 6, the memory gate electrodes 12, the source regions and the drain region themselves can also be reduced.

Next, over the main surface of the semiconductor substrate 1, an interlayer insulating film made up of, for example, the silicon nitride film 18 and the silicon oxide film 19 is formed by a CVD method. Subsequently, after the contact hole 20 is formed in the interlayer insulating film, the plug 21 is formed in the contact hole 20. The plug 21 includes a relatively thin barrier film made of, for example, a multilayer film of titanium and titanium nitride and a relatively thick conductive film made of tungsten, aluminum or the like formed so as to be covered with the barrier film. Then, by forming the first-layer wiring 22 made of, for example, tungsten, aluminum, copper or the like on the silicon oxide film 19, the memory cells MC1 shown in FIG. 1 are completed. Thereafter, through typical manufacturing process of a semiconductor memory device, the MONOS memory according to the first embodiment is manufactured.

As described above, in the first embodiment, since the upper-layer insulating films over the side surfaces of the memory gate electrodes are formed thicker than the upper-layer insulating films under the memory gate electrodes, the electric field at the location where BTBT occurs can be relaxed, and thus, the disturb resistance of the non-selected memory cell during writing by the SSI method can be improved, while suppressing influence on the write speed.

Conventionally, as the measures for the disturb prevention, the source lines and the memory gate lines are divided into a plurality of lines and the number of drivers for driving the lines is increased so as to reduce the number of memory cells connected to the same source line and the same memory gate line. However, when this method is used, there occurs a problem of the increase in the area occupied by a memory module due to the increase in the number of the drivers for driving the lines. By contrast, in the first embodiment, since the disturb resistance of the non-selected memory cell can be improved by forming the upper-layer insulating films over the side surfaces of the memory gate electrodes to be thicker than the upper-layer insulating films under the memory gate electrodes, the number of the drivers for driving the lines needs not be increased for disturb prevention, and the area occupied by the memory module can be reduced.

(Second Embodiment)

In the second embodiment of the present invention, an example of a manufacturing method of split-gate MONOS memory cells will be described. In the manufacturing method according to the second embodiment, a method of forming the upper-layer insulating films over the memory gate electrodes 12 is different from that of the first embodiment. The manufacturing method of the split-gate MONOS memory cells according to the second embodiment will be described with reference to FIG. 24.

Figure 24:
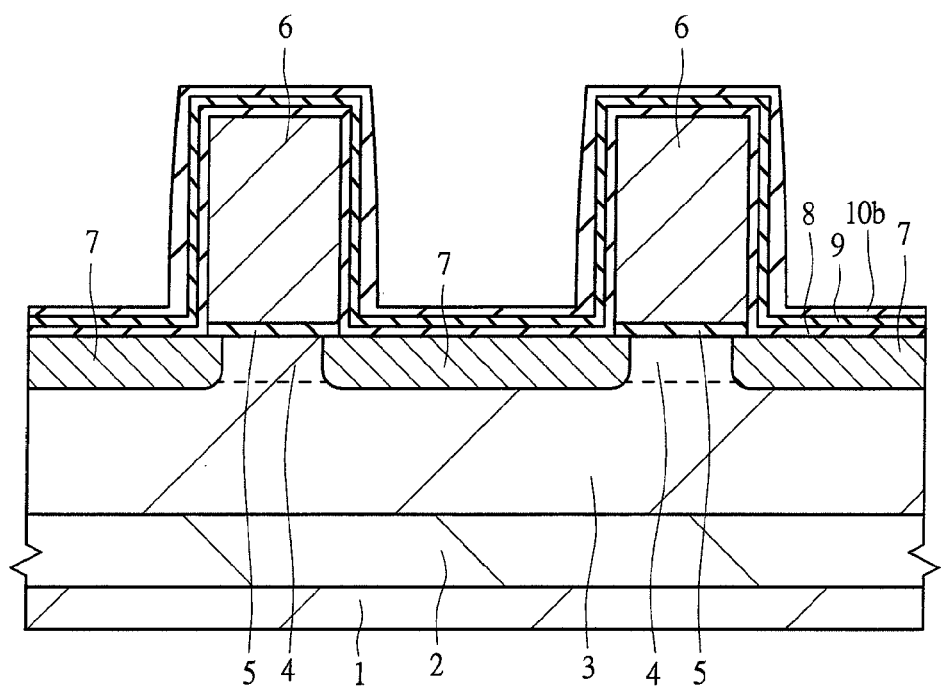
FIG. 24 is a cross-sectional view of the principal part illustrating a manufacturing method of split-gate MONOS memory cells according to the second embodiment of the present invention.

After the selection gate electrodes 6 are formed as described above with reference to FIG. 16 in the first embodiment, the lower-layer insulating film 8 made of, for example, a silicon oxide film, the charge storage layer 9 made of, for example, a silicon nitride film and an upper-layer insulating film 10b made of, for example, a silicon oxide film are sequentially deposited over the main surface of the semiconductor substrate 1 as shown in FIG. 24. The lower-layer insulating film 8 is formed by an ISSG oxidation method, and the thickness thereof is, for example, about 1.5 to 6 nm. The charge storage layer 9 is formed by a CVD method, and the thickness thereof is, for example, about 5 to 20 nm. The upper-layer insulating film 10b is formed by an ISSG oxidation method or a CVD method, and the thickness thereof is, for example, about 1 to 8 nm.

Then, the formed upper-layer insulating film 10b is subjected to dry etching. At this time, the insulating film 10b is etched so that the insulating film becomes thicker on the side surfaces of the selection gate electrodes 6 and becomes thinner in the other regions by controlling etching conditions. More specifically, in the step of forming the insulating film 10b, the insulating film 10b is formed to have a film thickness equal to the total film thickness of the two insulating films 10 and 11 formed in the first embodiment described above. In the subsequent etching of the insulating film 10b, the insulating film 10b is etched so that the underlying charge storage layer 9 is not exposed and the thickness of the insulating film 10b formed in parallel with the main surface of the semiconductor substrate 1 is equal to that of the insulating film 11 in the first embodiment described above. In this manner, the insulating films 10b formed over the side surfaces of the selection gate electrodes 6 are thicker than the insulating films 10b formed in parallel with the main surface of the semiconductor substrate 1.

Figure 25:
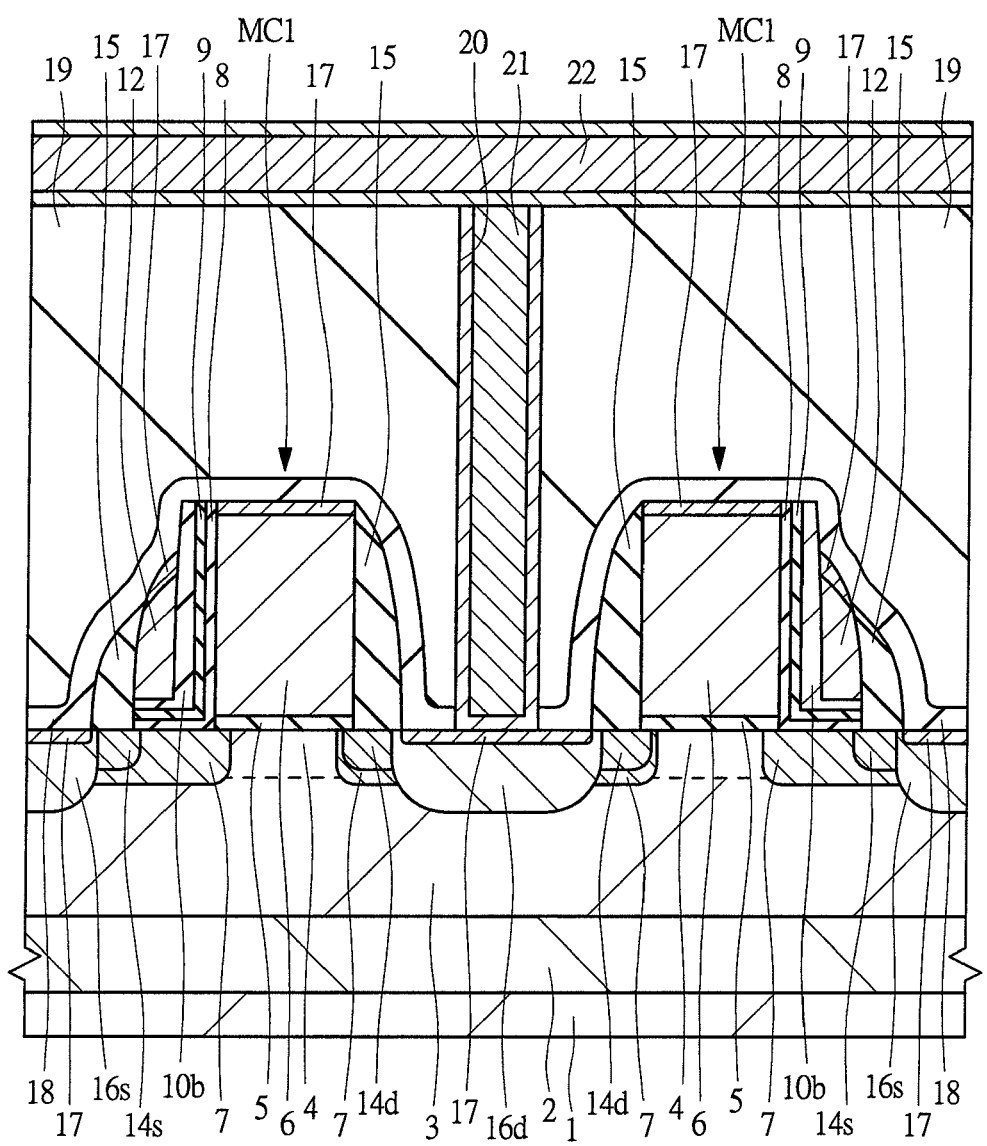
FIG. 25 is a cross-sectional view of the principal part showing the split-gate MONOS memory cells according to the second embodiment of the present invention.
Figure 26:
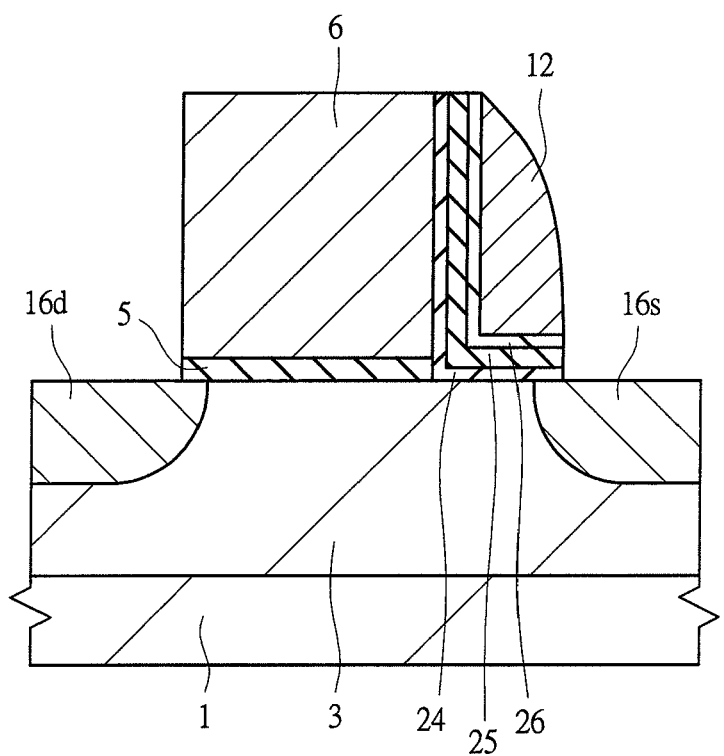
FIG. 26 is a cross-sectional view of the principal part showing an example of a structure of a conventional split-gate memory cell.

In the subsequent process including the step of depositing the second conductive film 12a made of a polysilicon film, the same steps as those shown in FIG. 19 and thereafter in the first embodiment are performed, and the memory cells MC1 shown in FIG. 25 are completed. Note that FIG. 25 is a cross-sectional view of the principal part showing the split-gate MONOS memory cells according to the second embodiment.

More specifically, sidewalls each made of a conductive film are formed on the side surfaces of the insulating film 10b shown in FIG. 24. Then, the above-described sidewalls formed over the respective one side surfaces of the selection gate electrodes 6 and the respective portions of the insulating film 8, the charge storage layer 9 and the insulating film 10b located under the foregoing sidewalls and over the side surfaces of the foregoing sidewalls are left, and the sidewalls formed over the respective other side surfaces of the selection gate electrodes 6 and the respective portions of the insulating film 8, the charge storage layer 9 and the insulating film 10b and the sidewalls located in the other regions are removed. Next, the semiconductor regions 14d and 14s are formed in the main surface of the semiconductor substrate 1, and the sidewalls 15 each made of an insulating film are formed over the side surfaces of the memory gate electrodes 12 made of the above-described sidewalls formed over the respective one side surfaces of the selection gate electrodes 6 and over the side surfaces of the selection gate electrodes 6. Thereafter, the source regions 16s and the drain region 16d are formed in the main surface of the semiconductor substrate 1. Then, after the silicide layers 17 are formed over the respective upper surfaces of the source regions 16s, the drain region 16d and the selection gate electrodes 6, an interlayer insulating film including the silicon nitride film 18 and the silicon oxide film 19 is formed over the main surface of the semiconductor substrate 1. Subsequently, after the contact hole 20 is formed in the interlayer insulating film, the plug 21 is formed in the contact hole 20 and the first-layer wiring 22 is formed on the silicon oxide film 19, whereby the memory cells MC1 are completed.

As shown in FIG. 25, the insulating film 10b is formed between the charge storage layer 9 and the memory gate electrode 12, and the thickness of the insulating film 10b between the side surface of the selection gate electrode 6 and the memory gate electrode 12 is larger than the thickness of the insulating film 10b between the memory gate electrode 12 and the semiconductor substrate 1.

As described above, according to the second embodiment, since the insulating film 10b can be formed thicker over the side surface of the memory gate electrode 12 and thinner under the memory gate electrode 12, the same effect as obtained in the first embodiment described above can be achieved.

In the step described above with reference to FIG. 18 in the first embodiment, in order to prevent the charge storage layer 9 from being damaged by the etching when the insulating film 10 is formed, low-damage etching conditions are set. However, in the second embodiment, since the charge storage layer 9 is not exposed when the insulating film 10b is formed, it is possible to prevent the charge storage layer 9 from being damaged.

Note that, in the case where the upper-layer insulating film made up of the two insulating films 10 and 11 is formed as in the first embodiment described above, if the insulating films 10 and 11 are formed of different materials, charges are trapped at the boundary between the different types of materials. Accordingly, the insulating films 10 and 11 are preferably formed of the same material, and in particular, the upper-layer insulating film is desirably made of a single-layer film formed at a time such as the insulating film 10b according to the second embodiment.

Furthermore, in the second embodiment, a silicon oxynitride film may also be used as the member of the insulating film 10b like in the first embodiment described above. This can increase the physical distance between the selection gate electrode 6 and the memory gate electrode 12, and further improvement of the disturb characteristic can be achieved.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the above-described embodiment, the charge storage layer made of a silicon nitride film is used as the insulating film for charge retention of the memory cell. However, instead of the silicon nitride film, a charge trapping insulating film such as a silicon oxynitride film, a tantalum oxide film, a hafnium oxide film or an aluminum oxide film may also be used. Furthermore, as the charge storage layer, a conductive material such as a polysilicon film or fine particles (dots) made of a conductive material may also be used.

The present invention is widely used in a semiconductor memory device having a nonvolatile memory cell in which charges are stored in an insulating film such as a silicon nitride film and a nonvolatile memory cell in which charges are stored in a polysilicon film.

What is claimed is:

1. A semiconductor memory device, comprising:
a nonvolatile memory cell having a first field effect transistor included in a first region of a main surface of a semiconductor substrate and a second field effect transistor included in a second region thereof and adjacent to the first field effect transistor;
a first gate electrode of the first field effect transistor formed in the first region;
a second gate electrode of the second field effect transistor formed in the second region;
a gate insulating film formed between the semiconductor substrate and the first gate electrode;
a charge storage layer formed between the semiconductor substrate and the second gate electrode and between the first gate electrode and the second gate electrode;
a first insulating film formed between the semiconductor substrate and the charge storage layer and between the first gate electrode and the charge storage layer; and
a second insulating film formed between the charge storage layer and the second gate electrode,
wherein a thickness of the second insulating film between the second gate electrode and the first gate electrode is larger than a thickness of the second insulating film between the second gate electrode and the semiconductor substrate, and is 1.5 times or less the thickness of the second insulating film between the second gate electrode and the semiconductor substrate.

2. The semiconductor memory device according to claim 1, wherein the charge storage layer contains polysilicon.

3. The semiconductor memory device according to claim 1, wherein the charge storage layer includes any of a silicon nitride film, a silicon oxynitride film, a tantalum oxide film, a hafnium oxide film and an aluminum oxide film.

4. The semiconductor memory device according to claim 1, wherein the second insulating film includes a silicon oxide film or a silicon oxynitride film.

5. The semiconductor memory device according to claim 1, wherein information is written by injecting hot electrons into the charge storage layer by a source side injection (SSI) method.

6. The semiconductor memory device according to claim 1, wherein information is erased by injecting hot holes into the charge storage layer by using a band-to-band tunneling (BTBT) phenomenon.

7. The semiconductor memory device according to claim 1, wherein the second insulating film is an insulating film in which a silicon nitride film or an amorphous silicon film is inserted between two silicon oxide films.

8. The semiconductor memory device according to claim 1, wherein the second insulating film is made up of a third insulating film formed between the charge storage layer and the second gate electrode and a fourth insulating film formed between the charge storage layer and the third insulating film, and
wherein the fourth insulating film is present between the second gate electrode and the first gate electrode and the fourth insulating film is not present between the second gate electrode and the semiconductor substrate.

9. The semiconductor memory device according to claim 8, wherein, when a relative dielectric constant of the third insulating film is e1 and a relative dielectric constant of the fourth insulating film is e2, a physical thickness of the fourth insulating film is (e2/e1)·0.5 times or less a physical thickness of the third insulating film between the second gate electrode and the semiconductor substrate.

10. The semiconductor memory device according to claim 8, wherein the third insulating film and the fourth insulating film each include a silicon oxide film.

11. The semiconductor memory device according to claim 8, wherein the third insulating film and the fourth insulating film each include a silicon oxynitride film.

12. A semiconductor memory device, comprising:
a nonvolatile memory cell having a first field effect transistor included in a first region of a main surface of a semiconductor substrate and a second field effect transistor included in a second region thereof and adjacent to the first field effect transistor;

a first gate electrode of the first field effect transistor formed in the first region;

a second gate electrode of the second field effect transistor formed in the second region;

a gate insulating film formed between the semiconductor substrate and the first gate electrode;

a charge storage layer formed between the semiconductor substrate and the second gate electrode and between the first gate electrode and the second gate electrode;

a first insulating film formed between the semiconductor substrate and the charge storage layer and between the first gate electrode and the charge storage layer; and a second insulating film formed between the charge storage layer and the second gate electrode, wherein a thickness of the second insulating film between the second gate electrode and the first gate electrode is larger than a thickness of the second insulating film between the second gate electrode and the semiconductor substrate, the second insulating film between the second gate electrode and the first gate electrode is made up of a third insulating film and a fourth insulating film, and the second insulating film between the second gate electrode and the semiconductor substrate is made up of the third insulating film and does not include the fourth insulating film.

13. The semiconductor memory device according to claim 12, wherein, between the second gate electrode and the first gate electrode, the fourth insulating film is formed between the charge storage layer and the third insulating film.

14. The semiconductor memory device according to claim 12, wherein the charge storage layer contains polysilicon.

15. The semiconductor memory device according to claim 12, wherein the charge storage layer includes any of a silicon nitride film, a silicon oxynitride film, a tantalum oxide film, a hafnium oxide film and an aluminum oxide film.

16. The semiconductor memory device according to claim 12, wherein the second insulating film includes a silicon oxide film or a silicon oxynitride film.

17. The semiconductor memory device according to claim 12, wherein information is written by injecting hot electrons into the charge storage layer by a source side injection (SSI) method.

18. The semiconductor memory device according to claim 12, wherein information is erased by injecting hot holes into the charge storage layer by using a band-to-band tunneling (BTBT) phenomenon.

19. The semiconductor memory device according to claim 12, wherein, when a relative dielectric constant of the third insulating film is e1 and a relative dielectric constant of the fourth insulating film is e2, a physical thickness of the fourth insulating film is (e2/e1)·0.5 times or less a physical thickness of the third insulating film between the second gate electrode and the semiconductor substrate.

20. The semiconductor memory device according to claim 12, wherein the third insulating film and the fourth insulating film each include a silicon oxide film.

21. The semiconductor memory device according to claim 12, wherein the third insulating film and the fourth insulating film each include a silicon oxynitride film.

* * * * *